(12) United States Patent
Jiang et al.

(10) Patent No.: US 10,403,348 B2
(45) Date of Patent: **\*Sep. 3, 2019**

(54) LARGE CURRENT-READOUT FERROELECTRIC SINGLE-CRYSTAL THIN FILM MEMORY AS WELL AS METHOD OF PREPARING THE SAME AND METHOD OF OPERATING THE SAME

(71) Applicant: Fudan University, Shanghai (CN)

(72) Inventors: Anquan Jiang, Shanghai (CN); Wenping Geng, Shanghai (CN)

(73) Assignee: Fudan University, Shanghai (CN)

( \* ) Notice: Subject to any disclaimer, the term of this patent is extended or adjusted under 35 U.S.C. 154(b) by 0 days.

This patent is subject to a terminal disclaimer.

(21) Appl. No.: 15/556,889

(22) PCT Filed: Apr. 12, 2016

(86) PCT No.: PCT/CN2016/079068
§ 371 (c)(1),
(2) Date: Sep. 8, 2017

(87) PCT Pub. No.: WO2017/177376
PCT Pub. Date: Oct. 19, 2017

(65) Prior Publication Data
US 2018/0096717 A1    Apr. 5, 2018

(51) Int. Cl.
*G11C 11/22* (2006.01)
*H01L 27/11502* (2017.01)
*H01L 49/02* (2006.01)

(52) U.S. Cl.
CPC .......... *G11C 11/2275* (2013.01); *G11C 11/22* (2013.01); *G11C 11/2273* (2013.01);
(Continued)

(58) Field of Classification Search
CPC . G11C 11/2273; G11C 11/2275; G11C 11/22; H01L 28/55; H01L 27/11502; H01L 28/56
See application file for complete search history.

(56) References Cited

U.S. PATENT DOCUMENTS 7,399,356 B2 \* 7/2008 Eun .................. C30B 23/02
117/86
9,171,602 B2 \* 10/2015 Sluka .................. G11C 11/22
(Continued)

FOREIGN PATENT DOCUMENTS

CN    CN102787356 A    11/2012
CN    CN104637948 A    5/2015
(Continued)

OTHER PUBLICATIONS

International Search Report (in Chinese) for PCT/CN2016/079068 dated Jan. 23, 2017, 5 pages.
(Continued)

*Primary Examiner* — David Lam
(74) *Attorney, Agent, or Firm* — Warner Norcross & Judd LLP

(57) ABSTRACT

Disclosed is a non-destructive large current-readout ferroelectric single-crystal thin film memory as well as a method of preparing the ferroelectric memory and a method of operating the ferroelectric memory. The large current-readout ferroelectric single-crystal thin film memory comprises a ferroelectric storage layer, which is a ferroelectric single-crystal storage layer. The non-destructive readout ferroelectric memory has a greatly increased read current in an on-state, and moreover, the data retention performance and data endurance performance are improved.

37 Claims, 8 Drawing Sheets

(52) U.S. Cl.
CPC ........ *H01L 27/11502* (2013.01); *H01L 28/55* (2013.01); *H01L 28/56* (2013.01)

(56) References Cited

U.S. PATENT DOCUMENTS

| | | | |
|---|---|---|---|
| 9,685,216 B2* | 6/2017 | Jiang | .................... H01L 27/115 |
| 2006/0018599 A1 | 1/2006 | Roberts et al. | |
| 2012/0295100 A1 | 11/2012 | Watanabe et al. | |
| 2014/0312385 A1 | 10/2014 | Sluka et al. | |
| 2015/0104637 A1 | 4/2015 | Watanabe et al. | |
| 2016/0358639 A1 | 12/2016 | Jiang et al. | |

FOREIGN PATENT DOCUMENTS

| | | |
|---|---|---|
| CN | CN104637949 A | 5/2015 |
| CN | CN105655342 A | 6/2016 |

OTHER PUBLICATIONS

English language abstract and machine translation for CN105655342 (A) extracted from http://worldwide.espacenet.com database on Sep. 19, 2017, 31 pages.

* cited by examiner

LARGE CURRENT-READOUT FERROELECTRIC SINGLE-CRYSTAL THIN FILM MEMORY AS WELL AS METHOD OF PREPARING THE SAME AND METHOD OF OPERATING THE SAME

CROSS-REFERENCE TO RELATED APPLICATIONS

This application is the National Stage of International Application No. PCT/CN2016/079068 filed on 12 Apr. 2016, the content of which is hereby incorporated by reference.

FIELD OF THE INVENTION

The present invention pertains to a technical field of ferroelectric memory, specifically to a non-destructive readout ferroelectric memory, and in particular, to a non-destructive readout ferroelectric single-crystal thin film memory having a large readout current as well as a method of preparing the ferroelectric memory and a method of operating the ferroelectric memory.

BACKGROUND

Ferroelectric random access memory (FRAM) is a non-volatile memory which stores data by using two different polarization orientations of a ferroelectric domain (or referred to as "electric domain") in an electric field as logic information ("0" or "1"), and can be also referred to as "ferroelectric memory".

The storage medium layer of a ferroelectric memory is a ferroelectric thin film layer having a reversible (or "switchable") ferroelectric domain. Currently, the fastest speed of reversing an electric domain that can be measured in a lab can reach up to 0.2 ns. In fact, it can be even faster. Usually, the reversing speed of electric domain determines the read-write time of the memory, a coercive voltage for electric domain reversing determines the read-write voltage of elements, and it will decrease almost in equal proportion to a reduction of the thickness of the thin film. Therefore, the ferroelectric memory has such advantages as fast speed of data reading, low drive voltage, high density of storage, etc, and has earned widespread attention and rapid development in recent years.

Currently, the ferroelectric memory can be mainly divided into two categories according to a basic mode of work or operation: a destructive readout (DRO) FRAM and a non-destructive readout (NDRO) ferroelectric memory.

The conventional non-destructive readout (NDRO) ferroelectric memory builds the storage unit using one transistor T and one ferroelectric capacitor C (i.e., 1T1C), and is based on charge-reading.

CN patent application No. 201510036256.X, entitled "Non-Destructive Readout Ferroelectric Memory as Well as Method of Preparing the Same and Method of Read/Writing the Same" and CN patent application No. 201510036586.1, entitled "Non-Destructive Readout Ferroelectric Memory as Well as Method of Preparing the Same and Method of Operating the Same" disclose another NDRO ferroelectric memory which realizes NDRO in a way of current reading (i.e., non-destructive current readout), and which has advantages of simple preparation, low cost and high storage density. Therefore, it has received a lot of attention in the industry.

However, such a non-destructive current readout ferroelectric memory has a relatively small read current. For example, at a pA order of magnitude, a stable read current disclosed in the above CN patents is also in a range of 100 to 1000 pA. A small read current will lead to problems of poor reading ability of data, slow speed of reading (of the order of millisecond to second), etc., which have significantly restricted a practical application of such a ferroelectric memory.

SUMMARY OF THE INVENTION

In order to address the above or other problems, the invention proposes a large current-readout non-destructive ferroelectric single-crystal thin film memory as well as a method of preparing the ferroelectric memory and a method of operating the ferroelectric memory.

According to an aspect of the invention, a non-destructive readout ferroelectric memory is provided, which comprises a ferroelectric thin film layer and a first electrode layer disposed on the ferroelectric thin film layer, wherein the first electrode layer comprises a first electrode and a second electrode that are disposed separately, and a polarization direction of the electric domain in the ferroelectric thin film layer is substantially not in parallel with a normal line direction of the ferroelectric thin film layer; when an electrical signal is applied between the first electrode and the second electrode, a partial electric domain in the ferroelectric thin film layer is enabled to be reversed, thus establishing a first domain wall conductive passage which connects the first electrode with the second electrode;

wherein, the ferroelectric thin film layer is a ferroelectric single-crystal thin film layer.

According to another aspect of the invention, a method of preparing the above described non-destructive readout ferroelectric memory is provided, characterized by comprising the steps of:

providing a substrate;

forming a ferroelectric single-crystal thin film layer; and forming a first electrode layer, which comprises a first electrode and a second electrode that are disposed separately, on the ferroelectric single-crystal thin film layer.

According to yet another aspect of the invention, a method for operating the above described non-destructive readout ferroelectric memory is provided, wherein the ferroelectric single-crystal thin film layer comprises a programming projected block which is disposed projectedly outwardly relative to the ferroelectric single-crystal thin film layer, and the first electrode and the second electrode are disposed at two sides of the programming projected block and are spaced apart at least by the programming projected block; when a write signal in a first direction is applied between the first electrode and the second electrode, an electric domain in at least a part of the programming projected block is enabled to be reversed, thus establishing said first domain wall conductive passage;

wherein when data "1" is written, the write signal in the first direction is applied between the first electrode and the second electrode so that an electric domain in at least a part of the programming projected block is enabled to be reversed, thus establishing said first domain wall conductive passage;

wherein when data "0" is written, a write signal in a second direction opposite to the first direction is applied between the first electrode and the second electrode so that the reversed electric domain in the programming projected block is enabled to return to the initial polarization direction, thus making said first domain wall conductive passage disappear.

The above features and operations of the invention will become more apparent from the following description and accompanying drawings.

BRIEF DESCRIPTION OF THE DRAWINGS

The above and other objectives and advantages of the invention will become thoroughly clear from the following detailed description in connection with the accompanying drawings, wherein identical or similar elements are denoted by identical reference numerals.

DETAILED DESCRIPTION OF THE INVENTION

Figure 1:
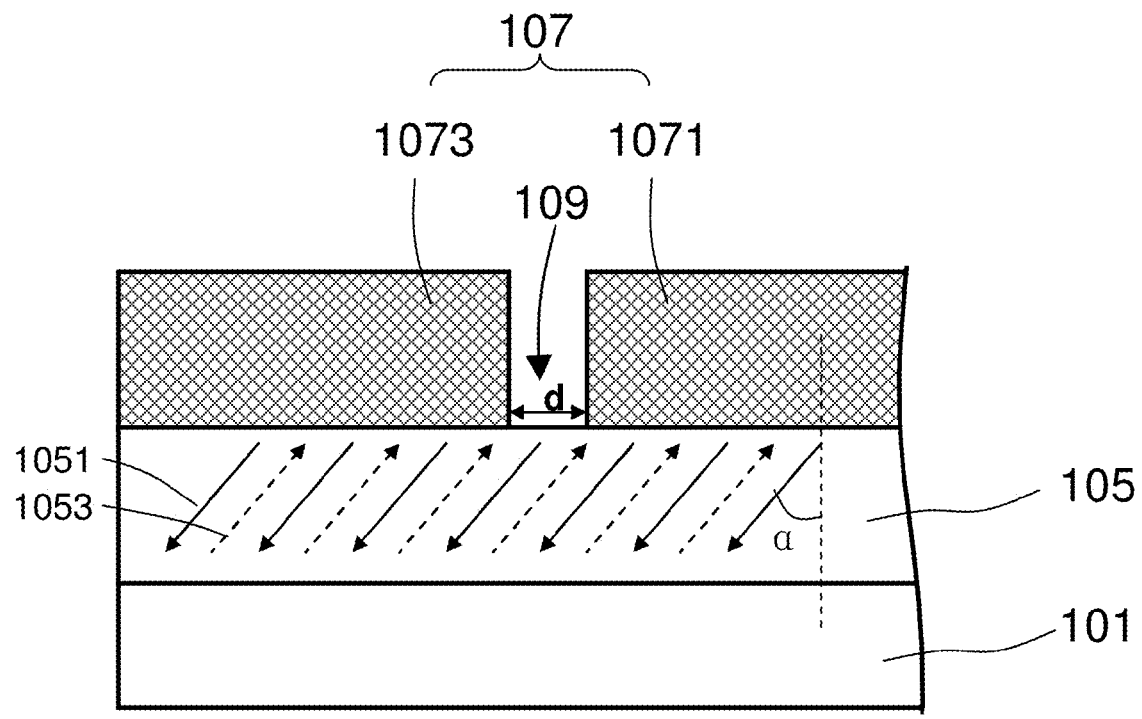
FIG. 1 is a schematic sectional structure view of a non-destructive readout ferroelectric memory according to a first embodiment of the invention.

Hereinafter, some of many possible embodiments of the invention will be described in order to provide a basic understanding of the invention and not to identify crucial or decisive elements of the invention or define the scope of protection.

In the drawings, the thicknesses of layers and areas have been exaggerated for clarity. The dimensional scaling relationship among the portions shown in the drawings does not reflect an actual dimensional scaling relationship.

In the following embodiments, an electric domain direction or polarization direction is illustratively given for the purpose of a clear description. However, it is to be understood that the electric domain direction or polarization direction of ferroelectric memory is not limited to the direction shown in the embodiment in the drawings.

Herein, the ferroelectric single-crystal thin film layer can be a single-crystal thin film formed by epitaxial single-crystal growth, or can be a thin film layer formed by being separated or cut from a single crystal, which refers to a single-crystal structure or a quasi single-crystal structure having no "crystal boundaries" of a poly-crystal structure inside. That is, each storage unit of the finished non-destructive readout ferroelectric memory has a single-crystal structure, and there is no limitation to the size of the unit.

Figure 2:
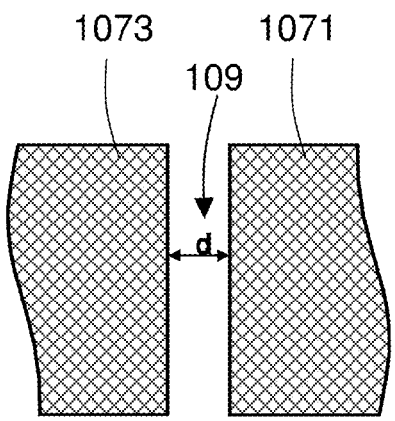
FIG. 2 is a top plan structure view of an upper electrode of the non-destructive readout ferroelectric memory shown in FIG. 1.

FIG. 1 is a schematic sectional structure view of a non-destructive readout ferroelectric memory according to a first embodiment of the invention, and FIG. 2 is a top plan structure view of an upper electrode of the non-destructive readout ferroelectric memory shown in FIG. 1.

As shown in FIG. 1, a partial sectional structure of the ferroelectric memory 10 is shown, which mainly comprises a substrate 101, a ferroelectric thin film layer 105 and a electrode layer 107, wherein the electrode layer 107 is located on the ferroelectric thin film layer 105 and is in contact with the ferroelectric thin film layer 105, and the upper electrode layer 107 is provided therein with a clearance 109 which divides the upper electrode layer 107 into several portions. Therefore, the upper electrode layer 107 at least comprises two or more than two electrodes that are separately disposed. In this example, the clearance 109 divides the upper electrode layer 107 into two portions, i.e., a first electrode 1071 and a second electrode 1073 which constitute a read-write electrode pair. In this embodiment, this read-write electrode pair constitutes the upper electrode layer 107 of this embodiment, which not only can be also used for a write operation of the ferroelectric memory 10 in this embodiment, but also can be used for a read operation of the ferroelectric memory 10 in this embodiment.

The substrate 101 can be formed by various substrate materials commonly used in a ferroelectric memory, e.g., Si, $SrTiO_3$ or $LiNbO_3$. Usually, the material of the substrate 100 is mainly determined by a lower electrode layer 103 and the ferroelectric thin film layer 105 together. In this embodiment, the substrate 101 can be a single-crystal Si substrate which is easily compatible with a semiconductor CMOS process and is advantageous for a massive production. In addition, the substrate material such as $SrTiO_3$ or $LiNbO_3$ is typically selected according to lattice constant requirements on the lower electrode layer 103 and the ferroelectric thin film layer 105 so that an epitaxial thin film layer with excellent performance is obtained.

The ferroelectric thin film layer 105 is formed above the substrate 101, and is formed from a ferroelectric material having an appropriate domain structure, especially a ferroelectric single-crystal material. Therefore, the ferroelectric thin film layer 105 is chosen as the ferroelectric single-crystal thin film layer. This ferroelectric single-crystal layer can be formed by growing on the substrate 101, or can be formed by firstly cutting or peeling off the surface of formed ferroelectric single crystal and then bonding or adhering it to the substrate 101. The specific method of preparing and forming the ferroelectric single-crystal thin film layer is not limiting, and will be described below in detail by way of example.

In a specific embodiment, a $LiNbO_3$ ferroelectric single-crystal thin film layer is formed by being bonded on a single-crystal Si substrate 101.

Specifically, firstly, by using the Czochralski method (abbreviated as "CZ method"), $Li_2CO_3$ powder having a high purity (e.g., reaching up to 99.99%) and $Nb_2O_5$ powder are melted at approximately 1250° C., and then isomorphic $LiNbO_3$ is formed by growing, wherein there is 48.5% $Li_2O$ mol; by using a dual-hearth CZ method and an automatic powder feeding system, a $LiNbO_3$ single crystal is generated, which has 49.6 mol. % $Li_2O$. In this way, a stoichiometric ratio between Li and Nb is the $LiNbO_3$ single crystal is close to or equal to 1:1. During this process, in order to increase the magnitude of current in the domain wall conductive passage in the finally formed ferroelectric single-crystal thin film layer, 2 mol. % MgO is doped into the $LiNbO_3$ single crystal. Then, using ion injecting and silicon slice bonding technology, a surface of the $LiNbO_3$ single crystal is peeled off bonding so as to form a $LiNbO_3$ ferroelectric single-crystal thin film layer. For example, firstly, $H^+$ or $He^+$ ions injection is used at the surface, and the depth of ions entering the $LiNbO_3$ single crystal is controlled by controlling the ion injection energy; secondly, the $LiNbO_3$ single crystal is cleaned after ion injection, and the ion injection surface is chemically bonded to a single-crystal silicon substrate which serves as the substrate 101, and a $SiO_2$ layer can be deposited onto the single-crystal silicon substrate 101 so as to improve the adhesion of the substrate 101 with the $LiNbO_3$ single crystal; the $LiNbO_3$ ferroelectric single-crystal thin film layer adhered on the substrate 101 is separated from the $LiNbO_3$ single crystal. By doing so, the ferroelectric thin film layer 105 (the ferroelectric single-crystal thin film layer) is prepared and formed, and the ferroelectric thin film layer 105 is specifically single-crystal $LiNbO_3$ doped with MgO.

It is noted that with differences in the process and materials or the like of the preparation, a ferroelectric single-crystal thin film layer 105 with difference types of materials can be obtained, and the specific type of material is not limited to the above embodiment. For example, the ferroelectric single-crystal thin film layer 105 can be also made from other single-crystal $LiNbO_3$ type of ferroelectrics (e.g., single-crystal $LiTaO_3$), and even in other alternative embodiments, single-crystal (Pb,Zr) $TiO_3$, La doped (Bi,La) $FeO_3$, or $BiFeO_3$ or single-crystal $Bi_4Ti_3O_{12}$, $(La,Bi)_4Ti_3O_{12}$ or $SrBi_2Ta_2O_9$.

By using MgO doping in the above $LiNbO_3$ ferroelectric single-crystal thin film layer, the magnitude of current can be increased when electric conduction is realized based on the domain wall conductive passage. The basic principle thereof is that the substitution with Mg ions can cause lattice distortion, and can generate a donor level.

In other embodiments, FeO or TaO can be also used to dope the $LiNbO_3$ ferroelectric single-crystal thin film layer or other ferroelectric single-crystal thin film layers. Of course, any combination of the MgO, FeO and TaO can be also used to dope the ferroelectric single-crystal thin film layer 105, wherein the mol. % of the doped material is 0.1% to 10%.

It is noted that in the process of peeling off and cutting the $LiNbO_3$ single crystals in the above embodiment, the $LiNbO_3$ ferroelectric single-crystal thin film layer is formed based on a X-direction cutting. Therefore, the finally prepared specific ferroelectric single-crystal thin film layer 105 is 2 mol. % MgO doped—X direction cutting—$LiNbO_3$ ferroelectric single-crystal thin film layer. In other embodiments, the $LiNbO_3$ ferroelectric single-crystal thin film layer can be also formed based on a cutting in the XYZ direction or XZ(YZ) direction.

In an embodiment, the thickness range of the ferroelectric thin film layer 105 can be larger than or equal to 5 nm or smaller than or equal to 22 μm; for example, it can be 40 nm, 80 nm or 200 nm.

Still referring to FIGS. 1 and 2, the first electrode 1071 and the second electrode 1073 in this embodiment can be formed by pattern etching the clearance 109 with a continuous metal thin film layer. Of course, in other embodiments, the first electrode 1071 and the second electrode 1073 can be formed by patterning respectively. In this specification, the first electrode 1071 and the second electrode 1073 form a read-write electrode pair. Herein, the term "read" reflects that they have at least the function of readout operation, and the term "write" reflects that they have at least the function of write operation.

The first electrode 1071 and/or the second electrode 1073 can be formed of a conductive material having a low resistance. For example, the material of the first electrode 1071 and the second electrode 1073 can be selected from one of Pt, $SrRuO_3$, $LaNiO_3$, Al, Cu, Ru, Ir and $IrO_2$ or a combination of more than one of Pt, $SrRuO_3$, $LaNiO_3$, Al, Cu, Ru, Ir and $IrO_2$. The thickness of the first electrode 1071 and/or the second electrode 1073 can be 5-100 nm, e.g., 20 nm. The first electrode 1071 and/or the second electrode 1073 can be formed by, for example, but not limited to, thin film deposition methods such as sputtering, chemical vapor deposition (CVD), pulse laser deposition (PLD), etc.

The clearance 109 is used for realizing a relative electric isolation between the first electrode 1071 and the second electrode 1073 (the electric isolation does not include a following situation in which a domain wall conductive passage is established during the operation process), that is, the first electrode 1071 and the second electrode 1073 are electrically isolated with the help of the ferroelectric thin film layer 105 or the like. The clearance 109 can be obtained by processing a flat metal layer with electron beam, nanoimprint or other photo-etching methods. However, the methods of forming the clearance 109 are not limited to the embodiments of the invention. The interval d of the clearance 109 can be in a range from larger than or equal to 2 nm to smaller than or equal to 10 μm, preferably from larger than or equal to 5 nm to smaller than or equal to 2 μm, e.g. it could be 10 nm, 100 nm, 1 μm, etc. A smaller interval d is more advantageous for improving a storage density of the ferroelectric memory, more advantageous for reducing a write voltage and a read voltage and increasing a read current, and will lead to less read power consumption and write power consumption. Therefore, the ferroelectric memory 10 in the embodiment of the invention can be scaled down, and optionally the clearance 109 can be a clearance having various nanometer-order dimensions. The shape of the clearance 109 is not limited to the shape shown in FIG. 2. In other embodiments, the clearance 109 can even have a serrated shape. The dimension of the width w (i.e., a width dimension of the clearance) of the first electrode 1071 and the second electrode 1073 in a direction perpendicular to the clearance can be in a range from larger than or equal to 2 nm to smaller than or equal to 10 μm, e.g., it could be 100 nm.

Still referring to FIG. 1, in the invention, the ferroelectric thin film layer 105 is required to satisfy a condition that the ferroelectric domain thereof has a component in the plane, i.e., it has an in-plane component (a projection of spontaneous polarization of the ferroelectric domain onto a film plane). The ferroelectric thin film layer 105 can form electric domains 1051 and 1053 in two directions as shown in FIG. 1. The polarization direction of the electric domain 1051 is completely opposite to the polarization direction of the electric domain 1053. When a biasing voltage is larger than a coercive voltage, the electric domain will be oriented in the electric field direction. Therefore, when the biasing electric field direction is opposite to the original electric domain direction and the biasing voltage is larger than the coercive voltage, the electric domain 1051 or 1053 will be reversed. In this embodiment, the polarization direction of the electric domain of the ferroelectric thin film layer 105 is substantially not perpendicular to a normal line (a broken line perpendicular to the ferroelectric thin film layer 105 as shown in the figure) direction of the ferroelectric thin film layer 105, or is substantially not perpendicular to the upper electrode layer 107. Specifically, as shown in FIG. 1, an angle α formed between the normal line of the ferroelectric thin film layer 105 and the polarization direction of electric domain is not equal to 0° or 180°. For example, α=45°. In this way, the electric domain 1051 or 1053 has an in-plane component, thus facilitating a write operation. Specifically, it can be realized by controlling a crystal orientation in which the ferroelectric thin film layer 105 grows or by controlling the cutting direction (e.g., a X-direction cutting or a XYZ-direction cutting).

The storage and operation principles of the ferroelectric memory 10 according to embodiment shown in FIG. 1 will be described below.

Figure 3:
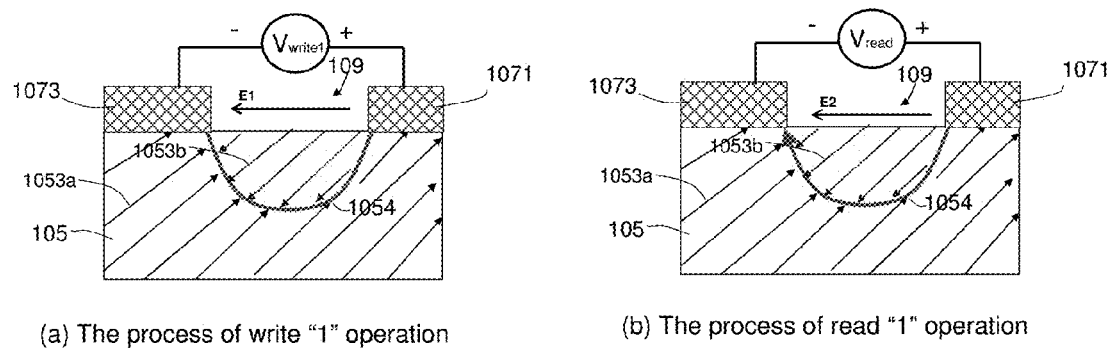
FIG. 3 is a schematic view showing the process and principle of the operation of writing "1" and reading "1" of the ferroelectric memory according to the embodiment shown in FIG. 1.

FIG. 3 is a schematic view showing the process and principle of the operation of writing "1" and reading "1" of the ferroelectric memory according to the embodiment shown in FIG. 1.

As shown in FIG. 3, in this embodiment, during a write operation, it is assumed that the polarization direction of the electric domain in the ferroelectric single-crystal thin film layer 105 is unitized to be the direction of the electric domain 1053 in FIG. 1 (in other embodiments, it can be also unitized to be the direction of the electric domain 1051 in FIG. 1. Firstly, as shown in FIG. 3(a), a write signal $V_{write1}$ is applied to the first electrode 1071 and the second electrode 1073 so that a positive voltage is biased onto the first electrode 1071 and a negative voltage is biased onto the second electrode 1073 (at this point, a "+" write voltage is defined). Based on the write signal $V_{write1}$ in this direction, an electric field E1 substantially in the direction as shown in FIG. 3(a) will be formed.

Due to existence of the clearance 109, the electric field E1 can partially have an influence on the electric domain of a part of the ferroelectric thin film layer 1053 which corresponds to the clearance 109. As shown in FIG. 3(a), with the increase of the electric field E1, in a corresponding part of the ferroelectric thin film layer 105 below the clearance 109, i.e., in a local part of the surface portion exposed to the clearance 109, the electric domain is reversed, i.e., the electric domain 1053 corresponding to the clearance 109 is partially reversed to form an electric domain 1053b as shown in FIG. 3(a), and the electric domain 1053 of other portions of the ferroelectric thin film layer 105 is not reversed since it is substantially not affected by the electric field E1 (or the influence by the electric field E1 is not sufficient to reverse the electric domain thereof), and correspondingly, an electric domain 1053a as shown is formed, wherein the polarization direction of the electric domain 1053b is substantially opposite to that of the electric domain 1053a. The electric domain 1053b is reversed using an electric component of the electric field E1 in a direction opposite to the polarization direction of the electric domain 1053a. Therefore, in case that the coercive voltage of the ferroelectric thin film layer is known, a minimum voltage for forming the electric domain 1053b can be calculated, i.e., a minimum write voltage.

At this point, at a adjoining portion between a portion of the ferroelectric thin film layer having the electric domain 1053a and a portion of the ferroelectric thin film layer having the electric domain 1053b, i.e., at a boundary wall or interface between the electric domain 1053a and the electric domain 1053b, a domain wall or domain boundary having charges is generated. Therefore, mainly on the basis of domain wall conductive mechanism, a conductive passage is created between the second electrode 1073 and the first electrode 1071, i.e., "domain wall conductive passage 1054". The creation of the domain wall conductive passage 1054 represents that the write "1" operation is successful, that is, data "1" is stored.

As shown in FIG. 3(b), a read signal $V_{read}$ is applied to the first electrode 1071 and the second electrode 1073 so that a positive voltage is biased onto the first electrode 1071 and a negative voltage is biased onto the second electrode 1073 (at this point, a "+" read voltage is defined). The direction of the read signal $V_{read}$ is also not limiting, and a "−" read voltage can be also applied to the first electrode 1071 and the second electrode 1073. The voltage of the read signal $V_{read}$ is smaller than the voltage of the write signal $V_{write1}$, which can prevent an erroneous write operation during the read operation process. For example, the voltage of the read signal $V_{read}$ is smaller than a coercive voltage for reversing the electric domain 1051 or 1053. Therefore, the electric field E2 generated by the read signal $V_{read}$ in FIG. 3(b) is smaller than a coercive field $E_c$, and thus there is no electric field component sufficient for reversing the electric domain 1053b. The electric domain 1053b and 1053a in the ferroelectric single-crystal thin film layer 105 substantially remain constant, and the domain wall conductive passage 1054 also remains constant. Correspondingly, the first electrode 1071 and the second electrode 1073 will generate a read current $I_{read1}$. At this point, the read current $I_{read1}$ is relatively large, which represents an on-state, thus reading out logic information "1".

Figure 4:
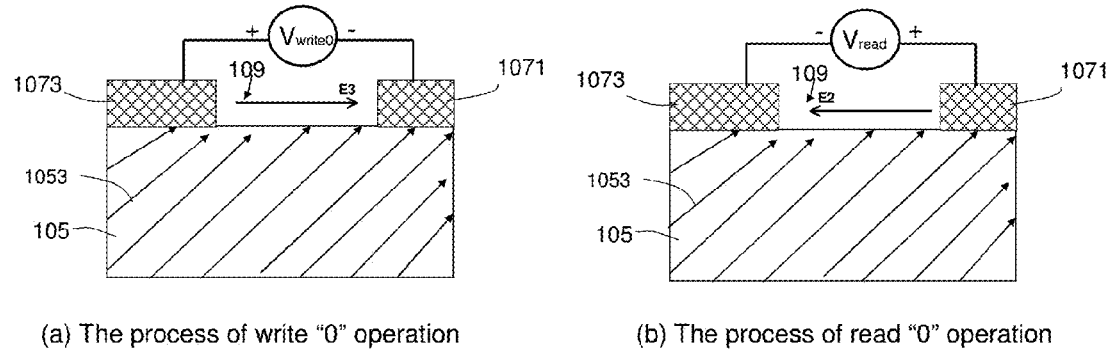
FIG. 4 is a schematic view showing the process and principle of the operation of writing "0" and reading "0" of the ferroelectric memory according to the embodiment shown in FIG. 1.

FIG. 4 is a schematic view showing the process and principle of the operation of writing "0" and reading "0" of the ferroelectric memory according to the embodiment shown in FIG. 1.

As shown in FIG. 4(a), a write signal $V_{write0}$ is applied to the first electrode 1071 and the second electrode 1073 so that a positive voltage is biased onto the second electrode 1073 and a negative voltage is biased onto the first electrode 1071 (at this point, a "−" write voltage is defined). Based on the write signal $V_{write0}$ in this direction, an electric field E3 substantially in the direction as shown in FIG. 4(a) will be formed, which has an opposite direction to the electric field E1 in FIG. 3(a). Based on the same principle in which the electric field E1 acts on the ferroelectric single-crystal thin film layer 105 in the process of writing "1" operation in FIG. 3(a), the electric field E3 can reverse the electric domain 1053b (as shown in FIG. 3(a)) so that it returns to the original polarization direction, thus being unitized to form the electric domain 1053 in the ferroelectric single-crystal thin film layer 105. At this point, the domain wall or domain boundary disappears, and the domain wall conductive passage 1054 originally generated between the second electrode 1073 and the first electrode 1071 also disappears. At this point, the write "0" operation is successful, that is, data "0" is stored.

As shown in FIG. 4(b), a read signal $V_{read}$ is applied to the first electrode 1071 and the second electrode 1073, which is the same as the read signal in FIG. 3(b). That is, a positive voltage is biased onto the first electrode 1071 and a negative voltage is biased onto the second electrode 1073 (at this point, a "+" read voltage is defined). Since the domain wall conductive passage 1054 disappeared, a read current $I_{read0}$ which is substantially 0 or very small is correspondingly generated between the first electrode 1071 and the second electrode 1073, which represents an off-state, thus reading out logic information "0".

In the above process of read "1" or read "0" operation, the electric domain of the ferroelectric single-crystal thin film layer 105 also substantially does not change. Therefore, after the read signal $V_{read}$ is cancelled, the state ("exist" or "disappear") of the domain wall conductive passage 1054 does not change, thus having no influence on the stored data "1" or "0" and realizing non-destructive readout. Moreover, in the above read "1" or read "0" operation, the state of data is distinguished by the magnitude of the current that has been read out, which is completely different from the way of reading charges in a conventional ferroelectric memory.

In the above ferroelectric memory according to the embodiment shown in FIG. 1, the read current $I_{read1}$ in the read "1" operation can reach up to an order of magnitude of 100 nA to 1000 nA, and there can be a difference of 4 to 7 in terms of the order of magnitude between the read current $I_{read1}$ in the read "1" operation and the read current $I_{read0}$ in the read "1" operation. Therefore, the readout window is large, and the readability of data is good. The inventor of the application has found that this is mainly because the use of single-crystal ferroelectric thin film layer 105 as a storage layer to form the storage unit has effectively reduced lattice defects, e.g., crystal boundary, domain boundary, defect rich area, a second phase, etc.

Moreover, in case where the read current of the ferroelectric memory 10 according to the embodiment shown in FIG. 1 is greatly increased, a reading speed thereof will also increase significantly.

The inventor of the application has found that data retention performance and data endurance performance of the above ferroelectric memory 10 according to the embodiment shown in FIG. 1 are greatly improved as compared to the non-destructive ferroelectric memory cited in the background section, and this is mainly because that in a single crystal structure, the positive and negative polarization directions of a single crystal are stable, and defects are fewer.

Figure 5:
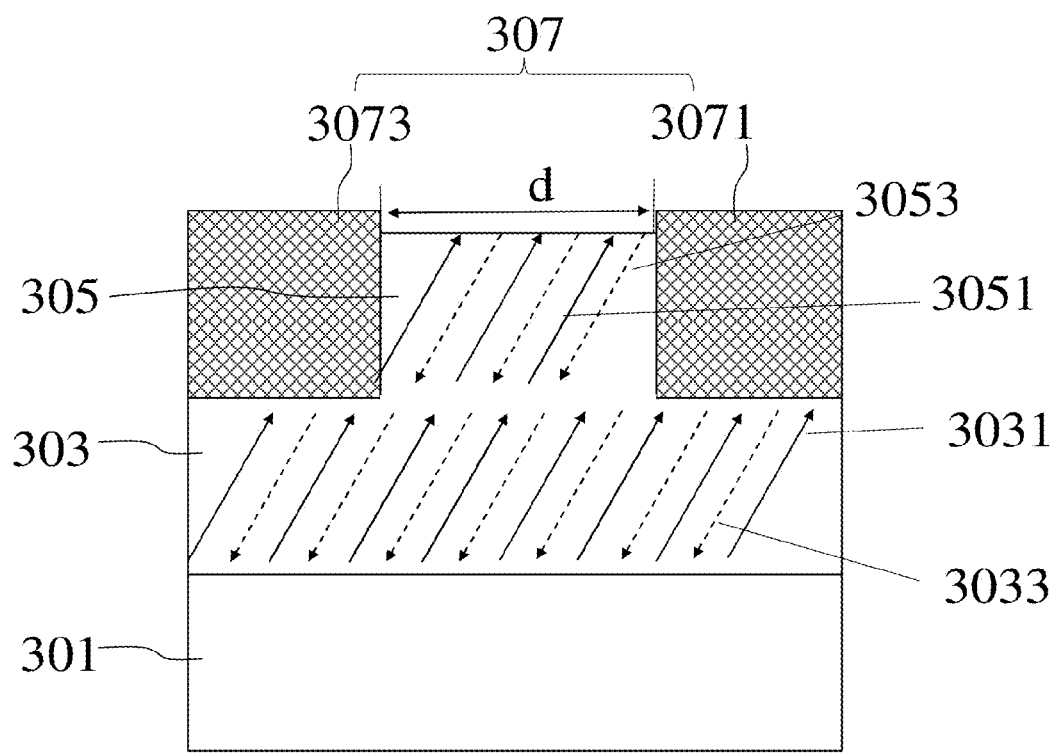
FIG. 5 is a schematic sectional structure view of a non-destructive readout ferroelectric memory according to another embodiment of the invention.
Figure 6:
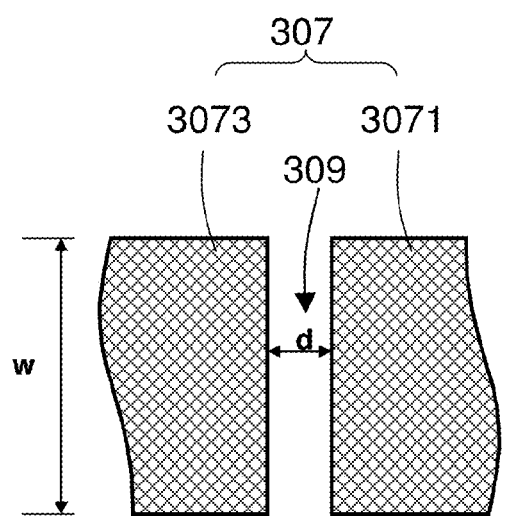
FIG. 6 is a top plan structure view of a read-write electrode of the non-volatile ferroelectric memory shown in FIG. 1.

FIG. 5 is a schematic sectional structure view of a non-destructive readout ferroelectric memory according to another embodiment of the invention, and FIG. 6 is a top plan structure view of a read-write electrode of the non-volatile ferroelectric memory shown in FIG. 1. As shown in FIG. 5, a schematic sectional structure view of a ferroelectric memory 30 is shown, which mainly comprises a substrate 301, a ferroelectric thin film layer 303, a programming projected block 305 disposed in the ferroelectric thin film layer 303 and a read-write electrode layer 307. The term "read" of the read-write electrode layer 307 reflects that it has at least the function of readout operation, and the term "write" of the read-write electrode layer 307 reflects that it has at least the function of write operation.

With continued reference to FIG. 5, the substrate 301 can be formed by various substrate materials commonly used in a ferroelectric memory, e.g., Si, $SrTiO_3$ or $LiNbO_3$. Usually, the material of the substrate 301 is mainly determined by the substrate 301 and the ferroelectric thin film layer 303 together. In this embodiment, the substrate 301 can be Si substrate which is easily compatible with a semiconductor CMOS process and is advantageous for a massive production. In addition, the substrate material such as $SrTiO_3$ or $LiNbO_3$ is typically selected according to lattice constant requirements on the ferroelectric thin film layer 303 so that an epitaxial thin film layer with excellent performance is obtained. Furthermore, the substrate 301 and the ferroelectric thin film layer 303 can be formed by the same type of material, i.e., ferroelectric material, comprising ferroelectric block ceramic and single crystal, etc.

As compared to the ferroelectric thin film layer 105 of the ferroelectric memory 10 according to the embodiment shown in FIG. 1, the ferroelectric thin film layer 303 shown in FIG. 5 can be also a ferroelectric single-crystal thin film layer, which has the same type of material and the same process of preparation as the above ferroelectric thin film layer 105 according to the embodiment shown in FIG. 1, and thus a repeated discussion is omitted herein.

The programming projected block 305 is disposed on the ferroelectric single-crystal thin film layer 303 and is prepared and formed integrally therewith. That is, the programming projected block 305 and the ferroelectric single-crystal thin film layer 303 are integral and have the same type of material, and they belong to a single crystal. Specifically, the programming projected block 305 which is projected outwardly relative to the ferroelectric single-crystal thin film layer 303 can be formed after pattern etching the ferroelectric single-crystal thin film layer 303. For example, by using a semiconductor photo-etching process, an image transfer of the programming projected block 305 can be realized through techniques such as electron beam direct writing or nano-imprint or photo-etching; then, using etching technique comprising dry method and wet method etching, the programming projected block 305 is formed on the surface of the ferroelectric single-crystal thin film layer 303. For example, the programming projected block 305 can be a boss having a rectangular block structure or a columnar structure, and there is no limitation to the specific shape of the programming projected block 305.

With continued reference to FIGS. 5 and 6, a first electrode 3071 and a second electrode 3073 that are separate from each other are disposed in the read-write electrode layer 307. The first electrode 3071 and the second electrode 3073 are disposed on the ferroelectric single-crystal thin film layer 303 and are located on two sides of the programming projected block 305 respectively. That is, the first electrode 3071 and the second electrode 3073 are disposed at two sides of the programming projected block 305 of the ferroelectric single-crystal thin film layer 303, and are spaced apart at least by the programming projected block 305. The first electrode 3071 and the second electrode 3073 are in contact with side edges of the programming projected block 305 respectively.

In this embodiment, the width d of the programming projected block 305 corresponds to the clearance interval between the first electrode 3071 and the second electrode 3073, and specifically d could be larger than or equal to 2 nm and smaller than or equal to 10 μm, e.g. it could be 10 nm, 100 nm, 1 μm, etc. A smaller interval d is more advantageous for improving a storage density of the ferroelectric memory, more advantageous for reducing a write voltage and a read voltage and reducing read power consumption and write power consumption. Therefore, the programming projected block 305 can be of a structure having various mircometer or nanometer dimensions. The height of the programming projected block 305 relative to the ferroelectric single-crystal thin film layer 303 (i.e., the thickness of the programming projected block 305) can be larger than or equal to 2 nm and smaller than or equal to 1 μm, e.g., it could be 50 nm.

In another embodiment, the read-write electrode layer 307 can be of a side wall structure disposed at two sides of the programming projected block 305. The first electrode 3071 and the second electrode 3073, which are two separate side walls, are disposed at two opposite side edges of the programming projected block 305.

Specifically, the first electrode 3071 and the second electrode 3073 can be formed of a conductive material having a low resistance. For example, the material of the first electrode 3071 and the second electrode 3073 can be selected from one of Pt, $SrRuO_3$, $LaNiO_3$, Al, Cu, Ru, Ir and $IrO_2$ or a combination of more than one of Pt, $SrRuO_3$, $LaNiO_3$, Al, Cu, Ru, Ir and $IrO_2$. The thickness of the first electrode 3071 and/or the second electrode 3073 can be 2-100 nm, e.g., 30 nm. The thickness of the read-write electrode layer 307 can be larger than or equal to the thickness of the programming projected block 305. The first electrode 3071 and/or the second electrode 3073 can be formed by, for example, but not limited to, thin film deposition methods such as sputtering, chemical vapor deposition (CVD), pulse laser deposition (PLD), etc.

Still referring to FIG. 1, in the invention, the ferroelectric thin film layer 303 and the programming projected block 305 are required to satisfy a condition that the ferroelectric domain thereof has a component in the plane, i.e., it has an in-plane component (a projection of spontaneous polarization of the ferroelectric domain onto a film plane). The ferroelectric thin film layer 303 can form electric domains 3031 and 3033 in two directions as shown in FIG. 1, and the programming projected block 305 can form electric domains 3051 and 3053 in two directions as shown in FIG. 1. The polarization directions of the electric domain 3031 and 3051 are completely opposite to the polarization directions of the electric domain 3033 and 3053 respectively. When a biasing voltage is larger than a coercive voltage, the electric domain will be oriented in the electric field direction. Therefore, when the biasing electric field direction is opposite to the original electric domain direction and the biasing voltage is larger than the coercive voltage, the electric domains 3031 and 3051 or 3033 and 3053 will be reversed. In this embodiment, the polarization direction of the electric domain of the ferroelectric thin film layer 303 and the programming projected block 305 is substantially not parallel to a normal line (a broken line perpendicular to the read-write electrode layer 307 as shown in the figure) direction of the read-write electrode layer 307. Specifically, it can be realized by controlling a crystal orientation in which the ferroelectric thin film layer 303 grows. By way of example, a $BiFeO_3$ ferroelectric thin film layer 303 having a thickness of 100 nm can grow epitaxially on the SrTiO3 substrate 303 having a crystal face (001), wherein the polarization direction of the electric domain of the $BiFeO_3$ ferroelectric thin film layer 303 is along a direction <111>.

It is noted that in order to facilitate illustration, the ferroelectric thin film layer 303 and the programming projected block 305 are shown separately in FIG. 5. However, in practice, it is possible that they are not separate; on the contrary, they can be continuous, and the electric domains in the ferroelectric thin film layer 303 and the programming projected block 305 constitute a single domain. For example, when the polarization directions of the ferroelectric thin film layer 303 and the programming projected block 305 are consistent, the electric domains 3031 and 3051 have a consistent polarization direction (or the electric domains 3033 and 3053 have a consistent polarization direction), and they can be represented continuously.

The storage and operation principles of the ferroelectric memory 30 according to embodiment shown in FIG. 5 will be described below.

Figure 7:
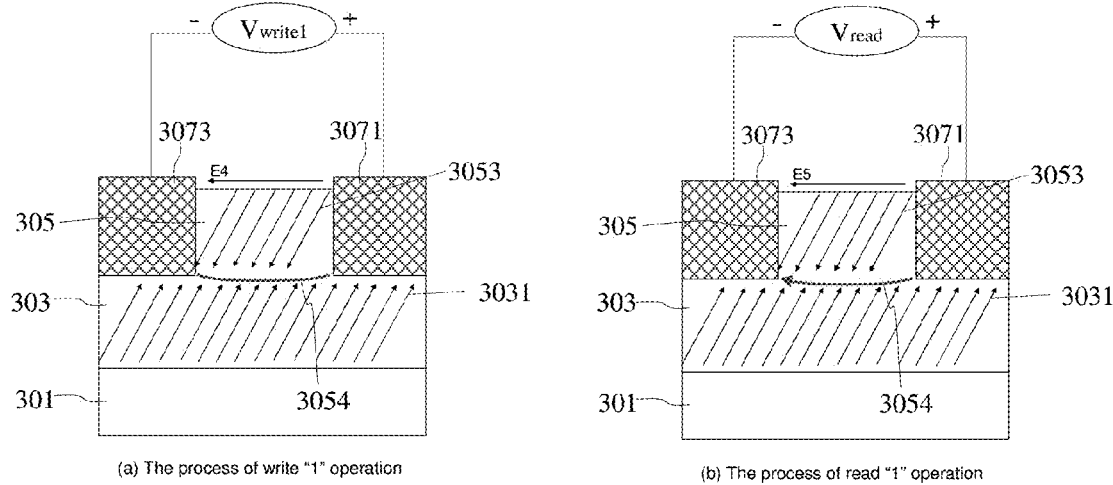
FIG. 7 is a schematic view showing the process and principle of the operation of writing "1" and reading "1" of the ferroelectric memory according to the embodiment shown in FIG. 5.

FIG. 7 is a schematic view showing the process and principle of the operation of writing "1" and reading "1" of the ferroelectric memory according to the embodiment shown in FIG. 5.

As shown in FIG. 7(*a*), in this embodiment, during a write "1" operation, it is assumed that the polarization direction of the electric domain in the ferroelectric single-crystal thin film layer 305 is unitized to be the direction of the electric domain 3031 in FIG. 5. During the write "1" operation, a write signal $V_{write1}$ is applied between the first electrode 3071 and the second electrode 3073 of the read-write electrode layer 307; that is, the write signal $V_{write1}$ is biased onto the read-write electrode pair formed by the second electrode 3073 and the first electrode 3071, wherein for the direction of the write signal $V_{write1}$, the second electrode 3073 is biased in a negative direction, and the first electrode 3071 is biased in a positive direction, thus forming an electric field E4 substantially in the direction as shown in FIG. 3(*a*). Since the first electrode 3071 and the second electrode 3073 are located at two sides of the programming projected block 305, based on the distribution characteristic of the electric field E4, the intensity of electric field in the programming projected block 305 is larger than the intensity of electric field in the ferroelectric single-crystal thin film layer 303, thus having a greater influence on the electric domain in the programming projected block 305. Consequently, the electric domain 3051 in the programming projected block 305 is easier to be reversed as compared to the electric domain 3031 in the ferroelectric single-crystal thin film layer 303. Therefore, under the action of the electric field E4, the electric domain 3051 is reversed to form the electric domain 3053. That is, an electric field component of the electric field E4 in a direction opposite to the polarization direction of the electric domain 3051 of the programming projected block 305 is larger than a coercive voltage for reversing the electric domain, the electric domain in the programming projected block 305 that has an in-plane ferroelectric polarization component is reversed, i.e., the electric domain 3051 is reversed to form the electric domain 3053. By setting the magnitude of the write signal $V_{write1}$, the electric domain 3051 of the programming projected block 305 can be reversed while the electric domain 3031 of the ferroelectric thin film layer 303 is substantially not reversed (or only a very small portion of the programming projected block 305 is reversed). That is, at this point, the electric domain 3031 of the ferroelectric thin film layer 303 is substantially not influenced by the electric field E4 (or the influence on the electric domain 3031 by the electric field E4 is not sufficient for reversing the electric domain 3031).

Therefore, at this point, the polarization direction of the electric domain 3053 in the programming projected block 305 will substantially be completely opposite to the polarization direction of the electric domain 3031 in the ferroelectric thin film layer 303, and a domain wall or domain boundary with charges is formed between the electric domain 3031 and the electric domain 3053 (the electric domain that was not reversed around the programming projected block 305), thus forming a domain wall conductive passage 3054. At this point, the first electrode 3071 and the second electrode 3073 can be conductively connected via the domain wall conductive passage 3054. The creation of the domain wall conductive passage 3054 represents that the write "1" operation is successful, that is, data "1" is stored.

It is noted that with the increase of the voltage of the write signal $V_{write1}$, it is possible that the electric domain 3031 of more and more portions in the ferroelectric single-crystal thin film layer 303 that are close to the programming projected block 305 will be reversed under the influence of the electric field E4, which is similar to the write operation principe of the ferroelectric memory 10 shown in FIG. 4. Therefore, the domain wall conductive passage 3054 will be projected downward continuously until it is close to the substrate 301. In this way, it is possible that the domain wall conductive passage 3054 will break at a position close to the substrate 301, thus shutting off the conductive passage between the second electrode 3073 and the first electrode 3071. Therefore, on one hand, the magnitude of the voltage of the write signal $V_{write1}$ can be set so that only the electric domain 3051 or 3053 of the programming projected block 305 is reversed while the electric domain 3031 or 3033 of the ferroelectric thin film layer 303 is not reversed; on the other hand, the thickness of the ferroelectric single-crystal thin film layer 303 can be set to be larger than the height of the programming projected block 305 so that the domain wall conductive passage 3054 formed after the write "1" operation cannot substantially longitudinally penetrate through the upper and lower surfaces of the ferroelectric thin film layer 303.

It is noted that the electric domain 3053 is reversed using an electric component of the electric field E4 in a direction opposite to the polarization direction of the electric domain 3031. Therefore, in case that the width d of the programming projected block and the coercive voltage $V_c$ are known, a minimum write voltage $V_{write1}$ for forming the electric domain 3053 by reversing the electric domain 3051 can be calculated.

As shown in FIG. 7(b), in the present embodiment, the read operation principe is completely different from that of a conventional ferroelectric memory, wherein during a read operation, the substrate 301 is not required to be biased a signal, and it can be suspended. The read signal $V_{read}$ is biased between the read-write electrode pair. In the following, an example will be described in which the signal is based between the first electrode 3071 and the second electrode 3073.

With continued reference to FIG. 7(b), during the read "1" operation, a read signal $V_{read}$ is biased between the first electrode 3071 and the second electrode 3073, wherein the second electrode 3073 is biased in the negative direction and the first electrode 3071 is biased in the positive direction, thus forming an electric field E5 (which is smaller than a coercive field $E_c$) in the direction as shown in the figure between the second electrode 3073 and the first electrode 3071. Since the electric field E5 does not contain an electric field component for reversing the electric domain 3053, the electric domain 3053 will remain completely constant, and the formed domain wall conductive passage 3054 is not shut off. At this point, the second electrode 3073 and the first electrode 3071 will generate a read current $I_{read1}$, which is relatively large and represents an on-state, thus reading out logic information "1".

It is noted that the read voltage of the read signal $V_{read}$ can be smaller than the write voltage of the write signal $V_{write1}$, which is advantageous for avoiding an "over-write" operation during the read operation.

It should be understood that when the read signal $V_{read}$ is cancelled, since the electric domain 3053 of the programming projected block 305 does not change during the above read operation process, the electric domain 3053 of the programming projected block 305 will also not change after the read signal $V_{read}$ is cancelled, and the domain wall conductive passage 3054 will exist stably. The data "1" can be always retained. Therefore, this read operation process is a non-destructive readout.

Figure 8:
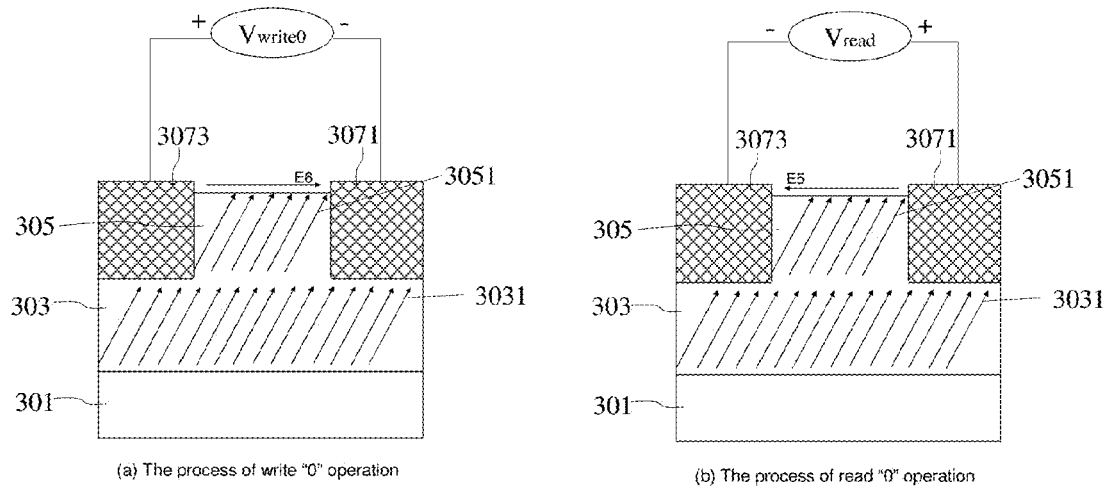
FIG. 8 is a schematic view showing the process and principle of the operation of writing "0" and reading "0" of the ferroelectric memory according to the embodiment shown in FIG. 5.

FIG. 8 is a schematic view showing the process and principle of the operation of writing "0" and reading "0" of the ferroelectric memory according to the embodiment shown in FIG. 5. As shown in FIG. 8(a), during a write "0" operation, a write signal $V_{write0}$ which has the opposite direction to the write signal $V_{write1}$ is biased onto the read-write electrode pair formed by the second electrode 3073 and the first electrode 3071, wherein the second electrode 3073 is biased in a positive direction, and the first electrode 3071 is biased in a negative direction, thus forming an electric field E6 substantially in the direction as shown in FIG. 8(a). The principle of the write operation performed by the write signal $V_{write0}$ on the programming projected block 305 is substantially the same as the principle of the write operation performed by the write signal $V_{write1}$ on the programming projected block 305. The electric field E6 can have an influence on the electric domain corresponding to the programming projected block 305, that is, can also have an influence on the electric domain 3053 as shown in FIG. 7(a). When an electric field component of the electric field E6 in a direction opposite to the polarization direction of the electric domain 3053 of the programming projected block 305 is larger than a coercive voltage for reversing the electric domain, the electric domain 3053 is reversed and returns to the original or initial polarization direction, thus being unitized to form the electric domain 3051. At this point, the polarization direction of the electric domain 3051 of the programming projected block 305 is the same as the polarization direction of the electric domain 3031 of the ferroelectric single-crystal thin film layer 303, and there is no domain wall or domain boundary therebetween. The domain wall conductive passage 3054 originally generated between the second electrode 3073 and the first electrode 3071 also disappears. At this point, the write "0" operation is successful, that is, data "0" is stored.

It is noted that the specific forms of the write signal $V_{write0}$ and write signal $V_{write1}$ are not limiting. For example, the form can be a voltage pulse signal having a certain frequency, etc.

As shown in FIG. 8(b), during the read "0" operation, a read signal $V_{read}$ is biased between the first electrode 3071 and the second electrode 3073, thus forming an electric field E5 in the direction shown in the figure. Since the intensity of the electric field E5 is smaller than a coercive field $E_c$ of the programming projected block 305, the electric domain 3051 of the programming projected block 305 will not be reversed during the read operation, and the domain wall conductive passage as shown in FIG. 7 cannot be formed. Since the domain wall conductive passage 3054 disappears, at this point, the second electrode 3073 and the first electrode 3071 do not generate a read current ($I_{read}$=0) or merely generate a very small read current, and the read current $I_{read}$ is in an off state, representing that logic information "0" is read out.

It should be understood that when the read signal $V_{read}$ is cancelled, since the electric domain 3051 of the programming projected block 305 does not change during the above read operation process, the electric domain of the programming projected block 305 will also not change after the read signal $V_{read}$ is cancelled, and the data "0" can be always retained. Therefore, this read operation process is a non-destructive readout.

It is noted that while described above is an example in which logic information "0" is stored in the polarization directions of the electric domain 3051 of the programming projected block 305 and the electric domain 3031 of the ferroelectric single-crystal thin film layer 303 and logic information "1" is stored in the polarization directions of the electric domain 3053 of the programming projected block 305 and the electric domain 3031 of the ferroelectric single-crystal thin film layer 303, those skilled in the art will understand it is also possible that logic information "0" is stored in the polarization directions of the electric domain 3053 of the programming projected block 305 and the electric domain 3033 of the ferroelectric single-crystal thin film layer 303 and logic information "1" is stored in the polarization directions of the electric domain 3051 of the programming projected block 305 and the electric domain 3033 of the ferroelectric single-crystal thin film layer 303. Correspondingly, the directions of voltage signals in the write operation and the read operation can be also changed adaptively so as to realize a read/write operation process similar to that shown in FIGS. 7 and 8.

Hereinafter, relevant tests have been conducted on the ferroelectric memory 50 according to the embodiment shown in FIG. 5, wherein the ferroelectric single-crystal thin film layer 303 (comprising the programming projected block 305) of the ferroelectric memory 50 is specifically a 2 mol. % MgO doped-X direction cutting-LiNbO$_3$ ferroelectric single-crystal thin film layer.

Figure 9:
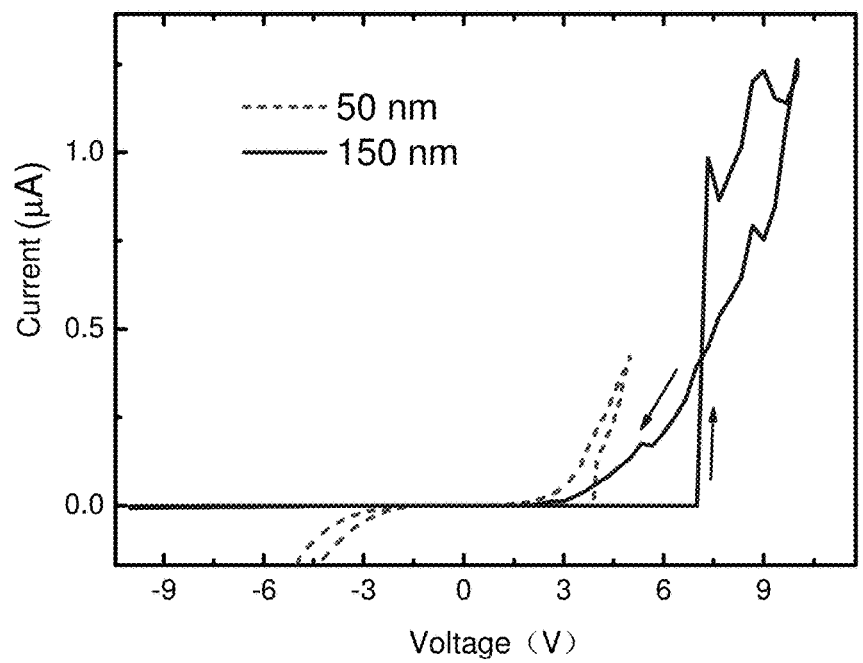
FIG. 9 is an I-V characteristic graph in a read/write operation of sweeping the voltage across the ferroelectric memory according to the embodiment shown in FIG. 5.

FIG. 9 is an I-V characteristic graph in a read/write operation of sweeping the voltage across the ferroelectric memory according to the embodiment shown in FIG. 5, wherein solid lines represents an I-V characteristic graph of a sample in which the width d of the programming projected block 305 is 150 nm, and broken lines represents an I-V characteristic graph of a sample in which the width d of the programming projected block 305 is 50 nm. As shown in FIG. 9, the voltage biased between the first electrode 3071 and the second electrode 3073 can be swept. For example, firstly, the voltage is gradually increased to +12V from 0V, is returned to 0V, and is then increased to -12V from 0V by sweeping. It can be seen that during the process of gradually increasing to +12V from 0V, the current will be increased suddenly, meaning that the write "1" operation is successfully and the domain wall conductive passage is established. Then, the maximum current that can be read out can reach up to a microampere order of magnitude. Therefore, the read current is greatly increased.

Figure 10:
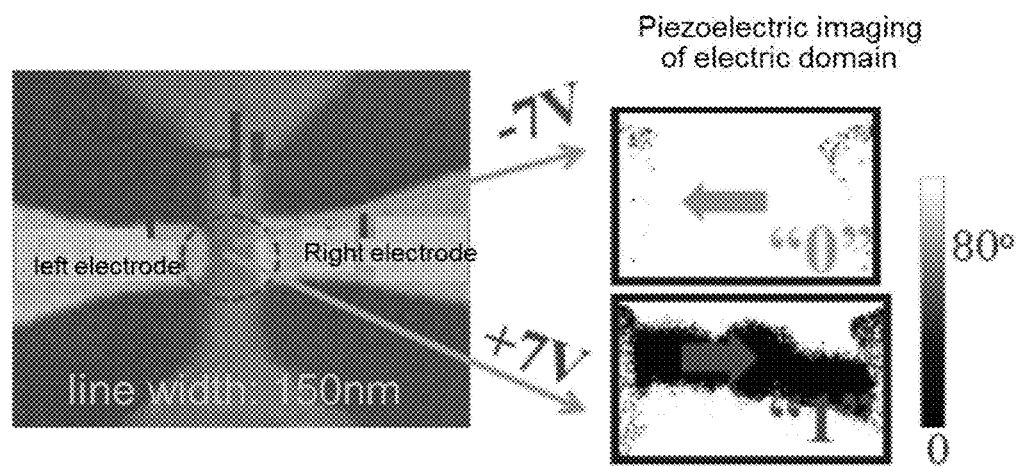
FIG. 10 is a schematic piezoelectric imaging view showing the establishing and disappearing of the domain wall conductive passage of the ferroelectric memory according to the embodiment shown in FIG. 5.

FIG. 10 is a schematic piezoelectric imaging view showing the establishing and disappearing of the domain wall conductive passage of the ferroelectric memory according to the embodiment shown in FIG. 5, wherein the width of the programming projected block 305 is 150 nm, "left electrode" and "right electrode" constitute a read-write electrode pair and are piezoelectrically imaged under a voltage of ±7V when biased write voltages (e.g., +7V, -7V) in different directions. An on or off state of the domain wall can be clearly seen therefrom; that is, when data "1" is written, the domain wall conductive passage is clearly established, and when data "0" is written, the domain wall conductive passage clearly disappears.

Figure 11:
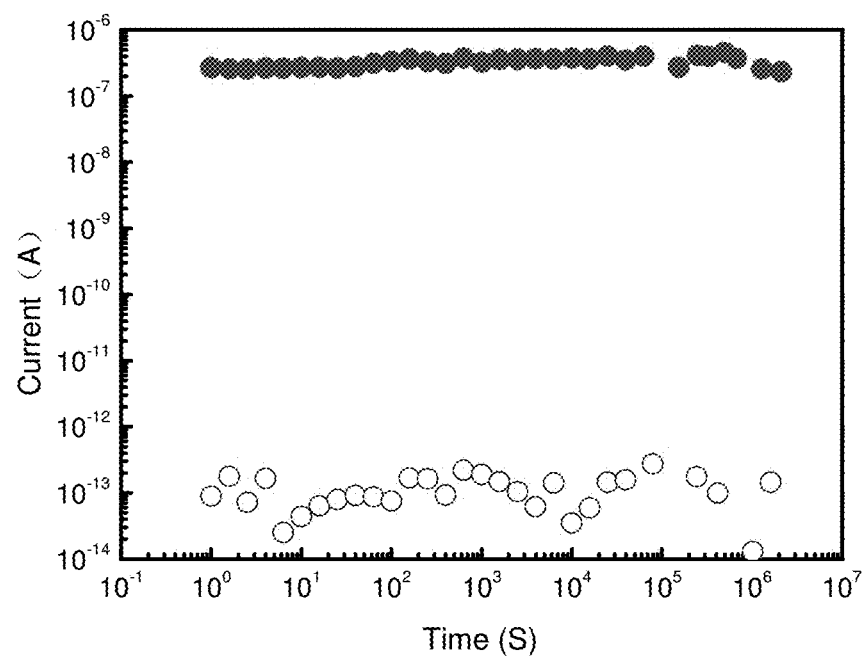
FIG. 11 is a schematic graph showing data retention performance of the ferroelectric memory according to the embodiment shown in FIG. 5.

FIG. 11 is a schematic graph showing data retention performance of the ferroelectric memory according to the embodiment shown in FIG. 5. In this test sample, the width of the programming projected block 305 is 150 nm, and the first electrode 3071 and the second electrode 3073 are Pt metal electrodes having a width of 100 nm. Under the action of the a read signal $V_{read}$=4V, a switch current that is read out changes with the time and forms the curve as shown in FIG. 11. It can be at least seen from FIG. 11 that in one aspect, the read current in the on state can reach up to $10^{-7}$ A to $10^{-6}$ A, and the read current is large; in another aspect, a ratio between the on-state current and the off-state current (i.e., an on/off ratio) can be larger than $10^6$, and the data window is large; and in further another aspect, the readout current is stable as time elapses, and the data can still be well retained after $10^6$ seconds, thus exhibiting an excellent data retention performance.

Figure 12:
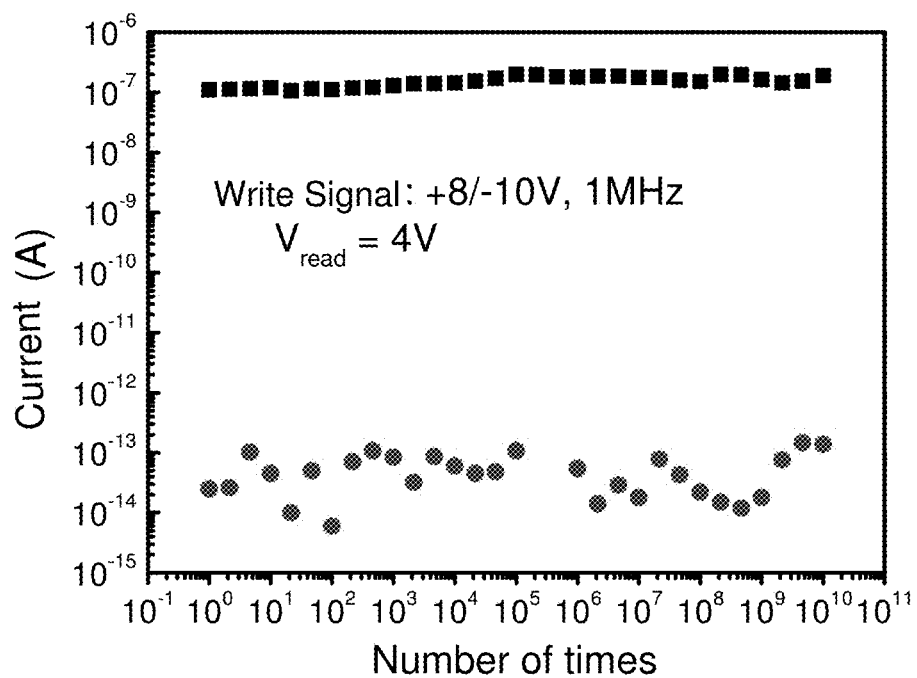
FIG. 12 is a schematic graph showing fatigue performance of the ferroelectric memory according to the embodiment shown in FIG. 5.

FIG. 12 is a schematic graph showing fatigue performance of the ferroelectric memory according to the embodiment shown in FIG. 5. In this test sample, the width of the programming projected block 305 is 150 nm, and the first electrode 3071 and the second electrode 3073 are Pt metal electrodes having a width of 100 nm. Under the action of a write voltage having a write period of +8V/-10V (comprising writing "0" and writing "1") and a period frequency of 1 MHz, after each time of writing "0" and writing "1", a corresponding switch current is read out under a voltage of 4V. FIG. 12 shows the variation of switch current for each write period with the number of write periods. It can be at least seen from FIG. 12 that in one aspect, the read current in the on state can reach up to $10^{-7}$ A, the read current is large and will not be reduced as the write operation continuously proceeds; in another aspect, a ratio between the on-state current and the off-state current (i.e., an on/off ratio) can be larger than $10^6$, and the data window is large; and in further another aspect, the read/write period is larger than $10^{10}$.

Therefore, it can be seen that in the ferroelectric memory 30 according to the embodiment shown in FIG. 5, at least because both the ferroelectric thin film layer 303 and the programming projected block 305 use ferroelectric single-crystal materials, the programming operation is performed in the same single-crystal structure or quasi single-crystal structure. Therefore, the read current it larger (which can reach up to an µA order of magnitude), and the readability of data is good. Moreover, reliabilities such as retention performance of data and fatigue performance are excellent. Furthermore, the on/off ratio is large. Also, since the ferroelectric memory 30 uses the programming projected block 305, the electric field of the first electrode 3071 and the second electrode 3073 that can be applied to two sides thereof can be better, and can have an influence on the electric domain in the programming projected block 305 more effectively. During the programming operation, by easily controlling the magnitude of the write voltage (or read voltage), the programming action (i.e., reversal of electric domain) will substantially take place in the programming projected block 305. The existence of the programming projected block 305 increases the electric field whose electric domain is effectively reversed, reduces the write voltage, and reduces a depolarization effect. Therefore, a more effective programming operation can be realized under the same magnitude of voltage, and the established domain wall conductive passage is more stable. In this way, the write voltage of writing "0" or writing "1" is further reduced, and the reliability of data storage is improved.

Figure 13:
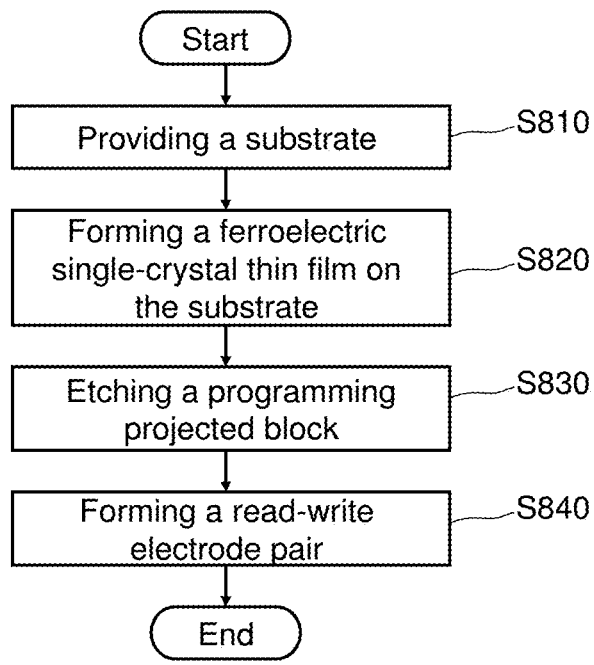
FIG. 13 is a schematic view showing the flowchart of a method of preparing the ferroelectric memory according to the embodiment shown in FIG. 5.

FIG. 13 is a schematic view showing the flowchart of a method of preparing the ferroelectric memory according to the embodiment shown in FIG. 5. As shown in FIGS. 5 and 13, firstly, a substrate 310 as shown in FIG. 1 is provided, whose material is mainly determined by the ferroelectric thin film layer 303 together, or can be the same as the ferroelectric material, i.e., a ferroelectric ceramic block or a single crystal. In this embodiment, the substrate 301 can be a Si substrate which is easily compatible with a semiconductor CMOS process.

Next, at step S820, the ferroelectric thin film layer 303 is formed. In this embodiment, the ferroelectric thin film layer 303 can comprise, but not limited to, the following materials: single-crystal $LiNbO_3$ type of ferroelectrics (e.g., single-crystal $LiTaO_3$), single-crystal $(Pb,Zr)TiO_3$, La doped $(Bi, La)FeO_3$, or $BiFeO_3$ or single-crystal $Bi_4Ti_3O_{12}$, $(La,Bi)_4Ti_3O_{12}$ or $SrBi_2Ta_2O_9$. The ferroelectric thin film layer 303 can be formed by thin film deposition methods such as ion-bonding technique, sputtering, chemical vapor deposition (CVD), pulse laser deposition (PLD), etc.

In an embodiment, a $LiNbO_3$ ferroelectric single-crystal thin film layer is formed by being bonded onto the single-crystal silicon substrate 301.

Specifically, firstly, by using the Czochralski method (abbreviated as "CZ method"), $Li_2CO_3$ powder having a high purity (e.g., reaching up to 99.99%) and $Nb_2O_5$ powder are melted at approximately 1250° C., and then isomorphic $LiNbO_3$ is formed by growing, wherein there is 48.5% $Li_2O$ mol; by using a dual-hearth CZ method and an automatic powder feeding system, a $LiNbO_3$ single crystal is generated, which has 49.6 mol. % $Li_2O$. In this way, a stoichiometric ratio between Li and Nb is the $LiNbO_3$ single crystal is close to or equal to 1:1. During this process, in order to increase the magnitude of current in the domain wall conductive passage in the finally formed ferroelectric single-crystal thin film layer, 2 mol. % MgO is doped into the $LiNbO_3$ single crystal. Then, using ion injecting and silicon slice bonding technology, a surface of the $LiNbO_3$ single crystal is peeled off bonding so as to form a $LiNbO_3$ ferroelectric single-crystal thin film layer. For example, firstly, $H^+$ or $He^+$ ions injection is used at the surface, and the depth of ions entering the $LiNbO_3$ single crystal is controlled by controlling the ion injection energy; secondly, the $LiNbO_3$ single crystal is cleaned after ion injection, and the ion injection surface is chemically bonded to a single-crystal silicon substrate which serves as the substrate 301, and a $SiO_2$ layer can be deposited onto the single-crystal silicon substrate 301 so as to improve the adhesion of the substrate 301 with the $LiNbO_3$ single crystal; the $LiNbO_3$ ferroelectric single-crystal thin film layer adhered on the substrate 301 is separated from the $LiNbO_3$ single crystal. By doing so, the ferroelectric thin film layer 303 (the ferroelectric single-crystal thin film layer) is prepared and formed, and the ferroelectric thin film layer 303 is specifically single-crystal $LiNbO_3$ doped with MgO.

By using MgO doping in the above $LiNbO_3$ ferroelectric single-crystal thin film layer, the magnitude of current can be increased when electric conduction is realized based on the domain wall conductive passage. In other embodiments, FeO or $Ta_2O_5$ can be also used to dope the $LiNbO_3$ ferroelectric single-crystal thin film layer or other ferroelectric single-crystal thin film layers. Of course, any combination of the MgO, FeO and $Ta_2O_5$ can be also used to dope the ferroelectric single-crystal thin film layer 105, wherein the mol. % of the doped material is 0.1% to 10%.

It is noted that in the process of peeling off and cutting the $LiNbO_3$ single crystals in the above embodiment, the $LiNbO_3$ ferroelectric single-crystal thin film layer is formed based on a X-direction cutting. Therefore, the finally prepared specific ferroelectric single-crystal thin film layer 303 is 2 mol. % MgO doped—X direction cutting—$LiNbO_3$ ferroelectric single-crystal thin film layer. In other embodiments, the $LiNbO_3$ ferroelectric single-crystal thin film layer can be also formed based on a cutting in the XYZ direction or XZ(YZ) direction.

Next, at step S830, the programming projected block 305 is formed by etching in the plane of the ferroelectric thin film layer 303. In this embodiment, the programming projected block 305 can be formed by firstly transferring an image onto the erroelectric thin film layer 303 using techniques such as semiconductor photo-etching, electron beam direct writing or nano-imprint, and then using dry method (reactive ion etching (RIE) or inductively coupled plasma etching (ICP)) and wet method etching. It is noted that the programming projected block 305 is prepared and formed on the single-crystal ferroelectric thin film layer 303. Therefore, both the ferroelectric thin film layer 303 and the programming projected block 305 are in the same single-crystal structure. Preferably, the height of the programming projected block 305 is smaller than the thickness of the etched ferroelectric thin film layer 303. For example, the height of the programming projected block 305 can be from 2 nm to 500 nm.

Next, at step S840, an in-plane read-write electrode pair is formed on the ferroelectric thin film layer 303 and the programming projected block 305. In this embodiment, the read-write electrode pair is mainly composed of the first electrode 3071 and the second electrode 3073 which are separated by the programming projected block 305. The material of the read-write electrode pair can be selected from one of Pt, $SrRuO_3$, $LaNiO_3$, Al, Cu, Ru, Ir and $IrO_2$ or a combination of more than one of Pt, $SrRuO_3$, $LaNiO_3$, Al, Cu, Ru, Ir and $IrO_2$. The thickness of the first electrode 3071 and the second electrode 3073 can be larger than or equal to the height of the programming projected block 305; for example, it could be 2-100 nm, e.g., 30 nm. The read-write electrode layer 307 in which the first electrode 3071 and the second electrode 3073 are located can be formed by, for example, but not limited to, thin film deposition methods such as sputtering, chemical vapor deposition (CVD), pulse laser deposition (PLD), etc. The first electrode 3071 and the second electrode 3073 can be further obtained by, for example, but not limited to, electron beam processing, nano-imprint or other photo-etching methods.

In this way, the ferroelectric memory 30 according to the embodiment shown in FIG. 5 is substantially formed.

Figure 14:
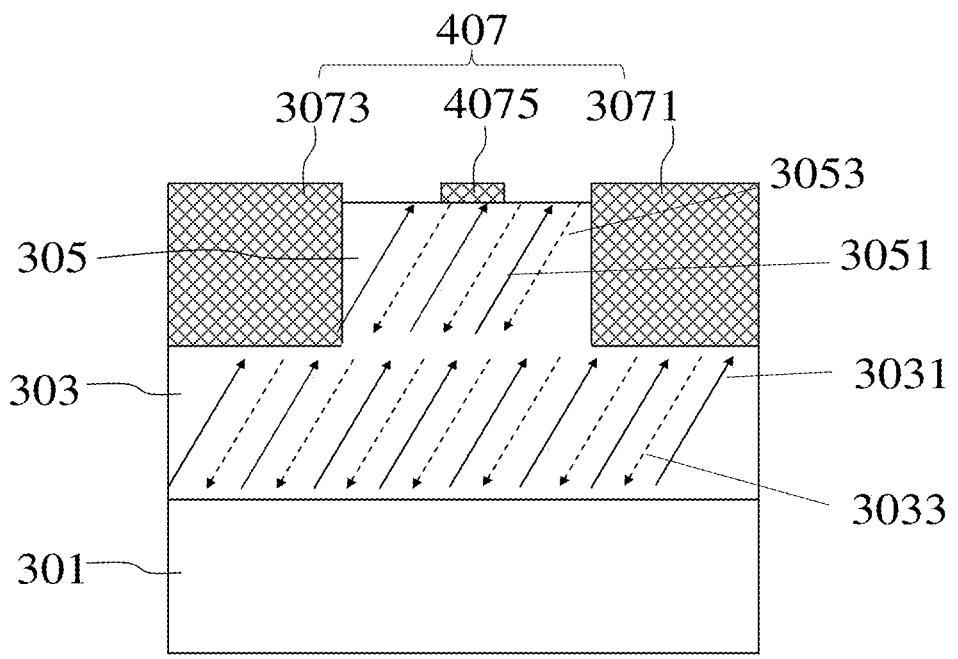
FIG. 14 is a schematic sectional structure view of a non-destructive readout ferroelectric memory according to yet another embodiment of the invention.

FIG. 14 is a schematic sectional structure view of a non-destructive readout ferroelectric memory according to yet another embodiment of the invention. In this embodiment, as compared to the ferroelectric memory 30 according to the embodiment shown in FIG. 5, the ferroelectric memory 40 further comprises a third electrode 4075 disposed on the programming projected block 305. Therefore, the first electrode 3071, the second electrode 3073 and the third electrode 4075 form a read-write electrode layer 407 of the ferroelectric memory 40 altogether. The third electrode 4075 has the function of read electrode and is used for applying an electrical signal during the read operation. In an embodiment, the third electrode 4075 is formed of the same material as the first electrode 3071 and the second electrode 3073, and is synchronously formed by pattern etching.

Other components in the ferroelectric memory 40 are substantially the same as those in the ferroelectric memory 30 according to the embodiment shown in FIG. 5, and thus a repeated discussion is omitted herein.

Figure 15:
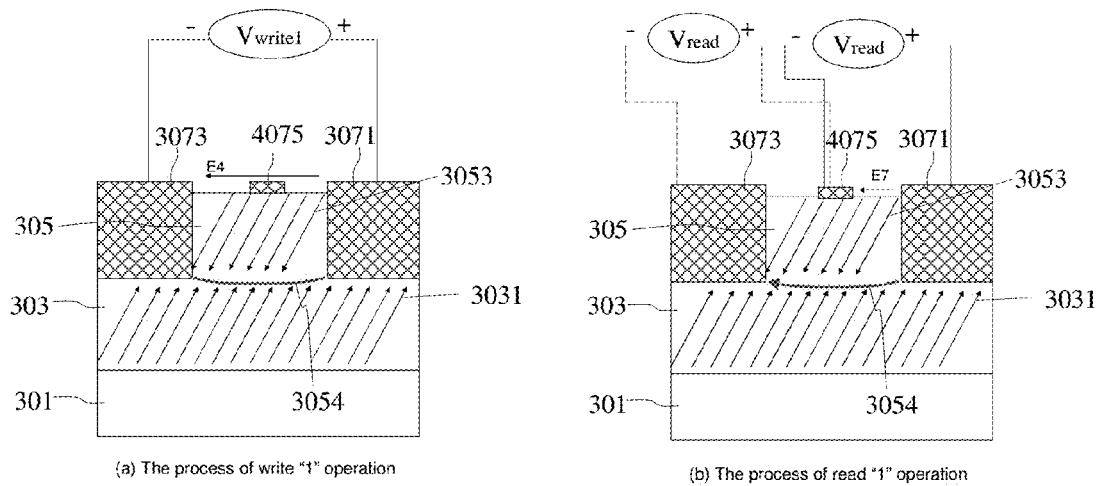
FIG. 15 is a schematic view showing the process and principle of the operation of writing "1" and reading "1" of the ferroelectric memory according to the embodiment shown in FIG. 14.

FIG. 15 is a schematic view showing the process and principle of the operation of writing "1" and reading "1" of the ferroelectric memory according to the embodiment shown in FIG. 14.

As shown in FIG. 15(a), in this embodiment, the write "1" operation is substantially the same as the write operation process shown in FIG. 7(a). Specifically, in this embodiment, an appropriate biasing can be applied to the third electrode 4075, e.g., the third electrode 4075 is grounded, thus effectively reducing the write voltage and also being advantageous for increasing a domain wall current that is read out; of course, the third electrode 4075 can be also suspended. A write signal $V_{write1}$ is biased between the first electrode 3071 and the second electrode 3073. Therefore, the principle of write "1" operation of the ferroelectric memory 40 is substantially the same as the principle of write "1" operation of the ferroelectric memory 30, and thus a repeated discussion is omitted herein. After the write "1" operation, as shown in FIG. 15(a), under the influence of the electric field E4, the electric domains 3051 and 3053 in the programming projected block 305 are unitized to be the electric domain 3053; that is, the electric domain 3051 is completely reversed to form the electric domain 3053. The polarization directions of the electric domains in the programming projected block 305 are the same, and are completely opposite to the polarization direction of the unitized electric domain 3051 in the ferroelectric thin film layer 303. Therefore, the domain wall conductive passage 3054 is established, which can conductively the first electrode 3071 and the second electrode 3073.

As shown in FIG. 15(b), during the read "1" operation, the read signal $V_{read}$ is biased between the third electrode 4075 and any of the first electrode 3071 and the second electrode 3073. In the following, an example will be described in which the read signal $V_{read}$ is biased between the first electrode 3071 and the third electrode 4075.

As shown in FIG. 15(b), during the read "1" operation, a read signal $V_{read}$ is biased between the first electrode 3071 and the third electrode 4075, wherein the third electrode 4075 is biased in the negative direction and the first electrode 3071 is biased in the positive direction, thus forming an electric field E7 (E7 is larger than the coercive field Ec) in the direction shown in the figure between the first electrode 3071 and the third electrode 4075. Since the electric field E7 does not contain an electric field component for reversing the electric domain 3053, in a corresponding part of the programming projected block 305 below the clearance between the first electrode 3071 and the third electrode 4075, the electric domain 3053 will not be reversed. In this way, no domain wall conductive passage like that formed in the write "1" operation will be generated in the programming projected block 305. That is, no domain wall conductive passage is established between the first electrode 3071 and the third electrode 4075. At this point, the first electrode 3071 and the third electrode 4075 do not generate a read current therebetween, and the read current $I_{read}=0$, which correspondingly represents that the domain wall conductive passage 3054 between the programming projected block 305 and the ferroelectric thin film layer 303 is in an on-state, thus reading out logic information "1".

After the read signal $V_{read}$ is cancelled, since the electric domain of the programming projected block 305 does not change during the above read operation process, the electric domain of the programming projected block 305 will also not change after the read signal $V_{read}$ is cancelled, and the stored data "1" does not change. Therefore, no destructive readout will occur.

It should be understood that when a read signal $V_{read}$ schematically shown in broken lines of FIG. 15(b) is biased between the second electrode 3073 and the third electrode 4075, logic information "1" can be also read out.

It is noted that unlike the requirement that the read voltage of the read signal $V_{read}$ shown in FIG. 7(b) must be smaller than the write voltage of the write signal $V_{write1}$, the readout voltage shown in FIG. 15(b) is completely not limited by the magnitude of the write voltage and will substantially have no influence on the domain wall conductive passage 3054. Therefore, no erroneous write operation will occur during the read operation.

Figure 16:
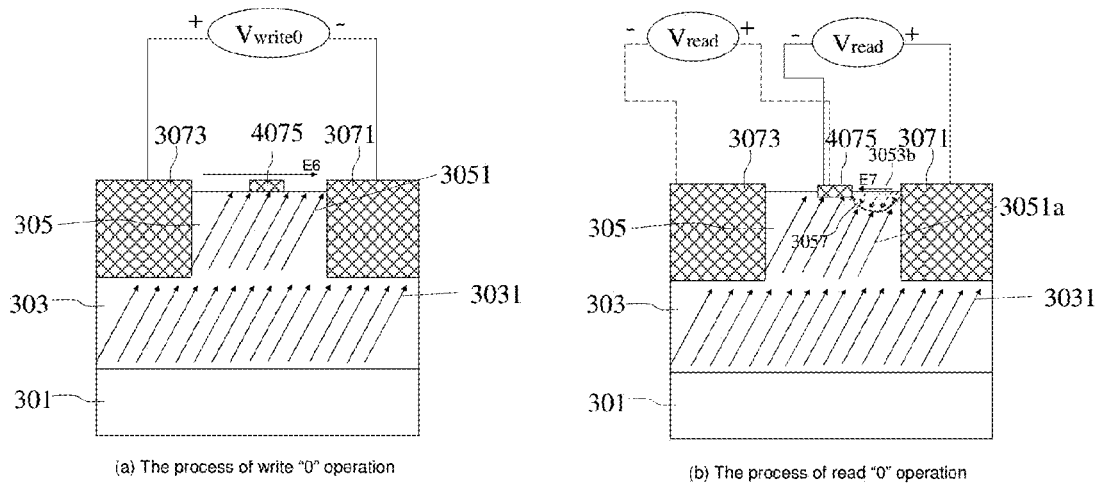
FIG. 16 is a schematic view showing the process and principle of the operation of writing "0" and reading "0" of the ferroelectric memory according to the embodiment shown in FIG. 14.

FIG. 16 is a schematic view showing the process and principle of the operation of writing "0" and reading "0" of the ferroelectric memory according to the embodiment shown in FIG. 14.

As shown in FIG. 16(a), in this embodiment, the write "0" operation is substantially the same as the write operation process shown in FIG. 8(a). In this embodiment, the third electrode 4075 can be suspended, or an appropriate biasing can be also applied to the third electrode 4075, e.g., the third electrode 4075 is grounded, thus effectively reducing the write voltage. A write signal $V_{write0}$ is biased between the first electrode 3071 and the second electrode 3073. Therefore, the principle of write "0" operation of the ferroelectric memory 40 is substantially the same as the principle of write "0" operation of the ferroelectric memory 30, and thus a repeated discussion is omitted herein.

After the write "0" operation, as shown in FIG. 16(a), under the influence of the electric field E4, the electric domains 3051 and 3053 in the programming projected block 305 are unitized to be the electric domain 3051; that is, the electric domain 3053 is completely reversed to form the electric domain 3051. The polarization directions of the electric domains in the programming projected block 305 are the same, and are completely opposite to the polarization direction of the unitized electric domain 3031 in the ferroelectric thin film layer 303. Therefore, the previously established domain wall conductive passage 3054 disappears.

It is noted that based on a distribution of the electric field intensity of the programming projected block 305 under the action of the write signal $V_{write0}$, it can be known that a larger write voltage of $V_{write0}$ will cause a deeper depth to which the electric domain 3053 is returned and reversed. Therefore, by controlling the magnitude of the voltage of the write signal $V_{write0}$, the electric domain 3053 can be completely reversed to the electric domain 3031; by way of example, as shown in FIG. 16(a), under the action of a write signal $V_{write0}$ having a certain magnitude of voltage, the electric domain 3053 corresponding to the programming projected block 305 (as shown in FIG. 15(a)) is completely reversed to form the electric domain 3051, and the domain wall conductive passage 3054 completely disappears.

As shown in FIG. 16(b), during the read "0" operation, the read signal $V_{read}$ is biased between the third electrode 4075 and any of the first electrode 3071 and the second electrode 3073. In the following, an example will be described in which the read signal $V_{read}$ is biased between the first electrode 3071 and the third electrode 4075.

As shown in FIG. 16(b), during the read "0" operation, a read signal $V_{read}$ is biased between the first electrode 3071 and the third electrode 4075, wherein the third electrode 4075 is biased in the negative direction and the first electrode 3071 is biased in the positive direction, thus forming an electric field E7 (E7 is larger than the coercive field Ec) in the direction shown in the figure between the first electrode 3071 and the third electrode 4075. Since the electric field E7 contains an electric field component for reversing the electric domain 3053, when an electric field component of the electric field E7 in a direction opposite to the polarization direction of the electric domain 3051 is larger than a coercive voltage for reversing the electric domain, in a corresponding part of the programming projected block 305 (in a local part of the programming projected block 305) below the clearance between the first electrode 3071 and the third electrode 4075, the electric domain 3051 is locally reversed to form the electric domain 3053b, and the part of the electric domain 3051 that is not reversed corresponds to 3051a. In this way, the polarization directions of the electric domain 3053b and 3051b are opposite and a domain wall or domain boundary is formed therebetween. In this way, a domain wall conductive passage like that formed in the write "1" operation will be generated in the programming projected block 305; that is, a domain wall conductive passage 3057 is established between the first electrode 3071 and the third electrode 4075. At this point, the first electrode 3071 and the third electrode 4075 can be conductively connected via the domain wall conductive passage 3057, thus generating a larger read current $I_{read}$, which correspondingly represents that the domain wall conductive passage 3054 between the programming projected block 305 and the ferroelectric thin film layer 303 is in an off-state, thus reading out logic information "0".

It should be understood that when a read signal $V_{read}$ schematically shown in broken lines of FIG. 16(b) is biased between the second electrode 3073 and the third electrode 4075, logic information "0" can be also read out.

It is further noted that after the current signal $I_{read}$ is read out, the read signal $V_{read}$ biased between the electrode 3071 and the third electrode 4075 is cancelled, and the electric field E7 disappears. At this point, under the action of a depolarization field, the electric domain 3053b will be influenced by the electric domain 3051a and will be reversed to substantially the original polarization direction; that is, the electric domain 3053b disappears instantaneously and substantially returns to the electric domain 3051 in a state before the read operation. The domain wall conductive passage 3057 also substantially disappears, and will however have no influence on the domain wall conductive passage 3054. Therefore, logic information "0" stored by the ferroelectric memory 40 before the read operation will not change after the read operation, thus realizing non-destructive read out.

Meanwhile, it should be further understood that in other embodiments, even if the electric field disappears and the electric domain 3053b does not reverse to the polarization direction before the read operation (i.e., the domain wall conductive passage 3057 always exists after the read signal is cancelled), the electric domain 3053b will have no influence on the logic information stored by the ferroelectric memory 40 since the direction of the read signal $V_{read}$ is relatively fixed, and the existence of the domain wall conductive passage 3057 will also not influence logic information that is subsequently read out. Moreover, it can be understood that when the write operation is performed after the read operation, it is certain that the electric domain 3053b will be polarized again, and the domain wall conductive passage 3057 will also be erased.

With continued reference to FIG. 16(b), in this embodiment, a smaller ratio between the volume of the part of the programming projected block 305 having electric domain 3053b and the volume of the part of the programming projected block 305 having electric domain 3051a would be advantageous; that is, a smaller volume proportion of the part of the programming projected block having partially reversed electric domain (e.g., electric domain 3053b) during the read operation would be advantageous. By designing the height, area parameters and read voltage of the programming projected block 305 and/or the interval d of the clearance between the first electrode 3071 and the third electrode 3075, the read operation performance of the ferroelectric memory 40 can be optimized. Optionally, the interval d of the clearance between the first electrode 3071 and the third electrode 3075 is smaller than the height of the programming projected block 305.

The direction of the read signal $V_{read}$ used in FIGS. 15 and 16 can be changed, and the states "1" and "0" of data stored therein can be also read out in a differentiated way. Moreover, the specific forms of the write signal $V_{write1}$, $V_{write0}$ and $V_{read}$ are not limiting. For example, the form can be a voltage pulse signal having a certain frequency, etc.

In the above description, directional terms (e.g., "upper", "lower", etc.) and similar terms that are used to describe the components in various embodiments represent the directions shown in the drawings or directions that can be understood by those skilled in the art. These directional terms are used for a relative description and clarification, instead of limiting the orientation in any embodiment to a specific direction or orientation.

The above embodiments mainly describe the ferroelectric memory of the invention as well as a method of operating the same and a method of preparing the same. In particular, the method and principle of read operation are described. While only some of the embodiments of the invention are described, those skilled in the art will understand that the invention can be carried out in many other forms without departing from the spirit and scope thereof. For example, the shapes of the first electrode 3071 and the second electrode 3073 can be changed, and the three-dimensional shape of the programming projected block 305 can be changed. Therefore, the disclosed examples and embodiments should be considered as illustrative rather than limiting. The invention can cover many variations and replacements without departing from the spirit and scope of the invention defined by the appended claims.

What is claimed is:

1. A non-destructive readout ferroelectric memory, comprising:
   a ferroelectric storage layer; and
   a first electrode layer disposed on the ferroelectric storage layer, wherein the first electrode layer comprises a first electrode and a second electrode that are disposed separately, and wherein a polarization direction of the electric domain in the ferroelectric storage layer is substantially not in parallel with a normal line direction of the ferroelectric storage layer;
   wherein when an electrical signal in a first direction is applied between the first electrode and the second electrode, a partial electric domain in the ferroelectric storage layer is enabled to be reversed so that a first domain wall conductive passage connecting the first electrode with the second electrode is established; and wherein the ferroelectric storage layer is a ferroelectric single-crystal storage layer.

2. The non-destructive readout ferroelectric memory according to claim 1, wherein the ferroelectric single-crystal storage layer is made from single-crystal $LiNbO_3$ type of ferroelectrics, or single-crystal $(Pb,Zr)$ $TiO_3$, La-doped $(Bi, La)$ $FeO_3$, $BiFeO_3$, $Bi_4Ti_3O_{12}$, $(La,Bi)_4Ti_3O_{12}$ or $SrBi_2Ta_2O_9$.

3. The non-destructive readout ferroelectric memory according to claim 2, wherein the ferroelectric single-crystal storage layer is made from single-crystal $LiNbO_3$ type of ferroelectrics, and wherein the $LiNbO_3$ type of ferroelectric is $LiNbO_3$ or $LiTaO_3$.

4. The non-destructive readout ferroelectric memory according to claim 2, wherein the mol. % of the doped material is 0.1% to 10%.

5. The non-destructive readout ferroelectric memory according to claim 1, wherein the ferroelectric single-crystal storage layer is a doped ferroelectric single-crystal storage layer, and the doped materials are MgO, FeO and $Ta_2O_5$ or any combination of MgO, FeO and $Ta_2O_5$.

6. The non-destructive readout ferroelectric memory according to claim 5, wherein the ferroelectric single-crystal storage layer is single-crystal $LiNbO_3$ doped with 0.1 mol % to 10 mol % of MgO.

7. The non-destructive readout ferroelectric memory according to claim 6, wherein a stoichiometric ratio between Li and Nb is the single-crystal $LiNbO_3$ is close to or equal to 1:1.

8. The non-destructive readout ferroelectric memory according to claim 1, wherein the ferroelectric single-crystal storage layer is formed based on a cutting in the X direction or XYZ direction or XZ(YZ) direction.

9. The non-destructive readout ferroelectric memory according to claim 8, wherein the ferroelectric single-crystal storage layer is bonded onto a silicon substrate.

10. The non-destructive readout ferroelectric memory according to claim 1, wherein a programming projected block which is disposed projectedly outwardly relative to the ferroelectric single-crystal storage layer is provided in the ferroelectric single-crystal storage layer, and the first electrode and the second electrode are disposed at two sides of the programming projected block and are spaced apart at least by the programming projected block; and wherein when a write signal in a first direction is applied between the first electrode and the second electrode, electric domain in at least a part of the programming projected block is enabled to be reversed so that the first domain wall conductive passage is established.

11. The non-destructive readout ferroelectric memory according to claim 10, wherein when a write signal in a second direction opposite to the first direction is applied between the first electrode and the second electrode, the reversed electric domain in the programming projected block is enabled to return to the initial polarization direction so that the first domain wall conductive passage disappears.

12. The non-destructive readout ferroelectric memory according to claim 11, wherein a read signal is applied between the first electrode and the second electrode so as to determine whether the first domain wall conductive passage is established; when the first domain wall conductive passage is established, it means that a first logic state is stored, and when the first domain wall conductive passage disappears, it means that a second logic state is stored.

13. The non-destructive readout ferroelectric memory according to claim 12, wherein the voltage of the read signal is smaller than a coercive voltage of the ferroelectric single-crystal storage layer.

14. The non-destructive readout ferroelectric memory according to claim 10, wherein a thickness of the ferroelectric single-crystal storage layer is set to be larger than a height of the programming projected block.

15. The non-destructive readout ferroelectric memory according to claim 14, wherein the height of the programming projected block is larger than or equal to 2 nm and smaller than or equal to 1 μm.

16. The non-destructive readout ferroelectric memory according to claim 14, wherein a thickness of the first electrode layer is larger than or equal to the height of the programming projected block.

17. The non-destructive readout ferroelectric memory according to claim 10, wherein a width of the programming projected block corresponds to an interval of a clearance between the first electrode and the second electrode, and is larger than or equal to 2 nm and smaller than or equal to 10 μm.

18. The non-destructive readout ferroelectric memory according to claim 10, wherein the first electrode layer further comprises a third electrode disposed above the programming projected block, and the third electrode is separately disposed from the first electrode and the second electrode so that a first clearance is defined between the first electrode and the third electrode, and a second clearance is defined between the second electrode and the third electrode.

19. The non-destructive readout ferroelectric memory according to claim 18, wherein, when a read signal is applied between the first electrode/the second electrode and the third electrode, a part of the programming projected block corresponding to the first clearance/the second clearance is partially reversed so that a second domain wall conductive passage connecting the first electrode/the second electrode and the third electrode is established.

20. The non-destructive readout ferroelectric memory according to claim 19, wherein a current state correspondingly read out when the second domain wall conductive passage is established represents that a first logic state is read out, and a current state correspondingly read out when the second domain wall conductive passage is not established represents that a second logic state is read out.

21. The non-destructive readout ferroelectric memory according to claim 19, wherein when the read signal is cancelled, the electric domain of the programming projected block that was partially reversed is returned to the original polarization direction, thus making the second domain wall conductive passage disappear.

22. The non-destructive readout ferroelectric memory according to claim 19, wherein the first clearance/the second clearance is smaller than a height of the programming projected block.

23. A method for operating the non-destructive readout ferroelectric memory according to claim 10, wherein when data "1" is written, a write signal in the first direction is applied between the first electrode and the second electrode so that an electric domain in at least a part of the programming projected block is enabled to be reversed, thus establishing the first domain wall conductive passage; and wherein when data "0" is written, a write signal in a second direction opposite to the first direction is applied between the first electrode and the second electrode so that the reversed electric domain in the programming projected block is enabled to return to the initial polarization direction, thus making the first domain wall conductive passage disappear.

24. The method for operating according to claim 23, wherein, when data "1" or "0" is read, a read signal is applied between the first electrode and the second electrode so as to determine whether the first domain wall conductive passage is established; the magnitude of current read out when the first domain wall conductive passage is established represents data "1" is read out, and the magnitude of current read out when the first domain wall conductive passage disappears represents data "0" is read out.

25. The method for operating according to claim 23, wherein the first electrode layer further comprises a third electrode disposed above the programming projected block, and the third electrode is separately disposed from the first electrode and the second electrode so that a first clearance is defined between the first electrode and the third electrode, and a second clearance is defined between the second electrode and the third electrode;

when data "1" or "0" is read, a read signal is applied between the first electrode/the second electrode and the third electrode so as to determine whether the second domain wall conductive passage is established; the magnitude of current read out when the second domain wall conductive passage is established represents data "0" is read out, and the magnitude of current read out when the second domain wall conductive passage disappears represents data "1" is read out.

26. The method for operating according to claim 25, wherein when data "1" or "0" is written, the third electrode is grounded or biased a voltage so as to reduce the magnitude of the voltage of the write signal.

27. A method of preparing the non-destructive readout ferroelectric memory according to claim 1, said method comprising:
providing a substrate;
forming a ferroelectric single-crystal storage layer; and
forming a first electrode layer, which comprises a first electrode and a second electrode that are disposed separately, on the ferroelectric single-crystal storage layer.

28. The method of preparing according to claim 27, wherein the ferroelectric single-crystal storage layer is made from single-crystal $LiNbO_3$ type of ferroelectrics, or single-crystal $(Pb,Zr)TiO_3$, La-doped $(Bi,La)FeO_3$, $BiFeO_3$, $Bi_4Ti_3O_{12}$, $(La,Bi)_4Ti_3O_{12}$ or $SrBi_2Ta_2O_9$.

29. The method of preparing according to claim 28, wherein the ferroelectric single-crystal storage layer is made from single-crystal $LiNbO_3$ type of ferroelectrics, and wherein the $LiNbO_3$ type of ferroelectric is $LiNbO_3$ or $LiTaO_3$.

30. The method of preparing according to claim 27, wherein the ferroelectric single-crystal storage layer is a doped ferroelectric single-crystal storage layer, and the doped materials are $MgO$, $FeO$ and $Ta_2O_5$ or any combination of $MgO$, $FeO$ and $Ta_2O_5$.

31. The method of preparing according to claim 30, wherein the mol. % of the doped material is 0.1% to 10%.

32. The method of preparing according to claim 30, wherein the ferroelectric single-crystal storage layer is single-crystal $LiNbO_3$ doped with 0.1 mol % to 10 mol % of $MgO$.

33. The method of preparing according to claim 32, wherein a stoichiometric ratio between Li and Nb is the single-crystal $LiNbO_3$ is close to or equal to 1:1.

34. The method of preparing according to claim 27, wherein forming the ferroelectric single-crystal storage layer comprises:
forming ferroelectric single crystals;
cutting the ferroelectric single crystals in X direction or XYZ direction or XZ(YZ) direction so as to form a ferroelectric single-crystal thin film; and
placing the ferroelectric single-crystal thin film onto the substrate so as to form the ferroelectric single-crystal storage layer.

35. The method of preparing according to claim 27, wherein forming the ferroelectric single-crystal storage layer comprises:
pattern etching the ferroelectric single-crystal storage layer so as to form a programming projected block, wherein the first electrode and the second electrode are disposed at two sides of the programming projected block and are spaced apart at least by the programming projected block.

36. The method of preparing according to claim 35, wherein at forming the first electrode layer, a metal layer for forming the first electrode layer is pattern etched so as to form the first electrode and the second electrode.

37. The method of preparing according to claim 35, wherein at forming the first electrode layer, a metal layer for forming the first electrode layer is pattern etched so as to form the first electrode, the second electrode and the third electrode, wherein the third electrode is disposed above the programming projected block.

* * * * *